United States Patent
Endo

(10) Patent No.: US 12,506,311 B2
(45) Date of Patent: Dec. 23, 2025

(54) ROTARY CONNECTOR

(71) Applicant: ALPS ALPINE CO., LTD., Tokyo (JP)

(72) Inventor: Yuki Endo, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 352 days.

(21) Appl. No.: 18/450,551

(22) Filed: Aug. 16, 2023

(65) Prior Publication Data

US 2024/0266794 A1 Aug. 8, 2024

Related U.S. Application Data

(63) Continuation of application No. PCT/JP2022/007746, filed on Feb. 24, 2022.

(30) Foreign Application Priority Data

Mar. 15, 2021 (JP) ................. 2021-041406

(51) Int. Cl.
*H01R 35/00* (2006.01)
*H01R 35/02* (2006.01)

(52) U.S. Cl.
CPC ................. *H01R 35/025* (2013.01)

(58) Field of Classification Search
CPC ...... H01R 35/025; H01R 12/78; H01R 39/64; H05K 3/361
See application file for complete search history.

(56) References Cited

U.S. PATENT DOCUMENTS

| | | | | |
|---|---|---|---|---|
| 5,286,219 A * | 2/1994 | Ueno | ................. | H02G 11/00 439/15 |
| 5,827,080 A * | 10/1998 | Tanaka | ................. | H01R 35/025 439/164 |
| 6,475,027 B1 * | 11/2002 | Boldt | ................. | H01R 12/772 439/496 |
| 6,854,977 B2 * | 2/2005 | DuRocher | ................. | H01R 35/025 439/15 |

(Continued)

FOREIGN PATENT DOCUMENTS

| | | |
|---|---|---|
| JP | 2002-246133 | 8/2002 |
| JP | 2006-502549 | 1/2006 |

(Continued)

OTHER PUBLICATIONS

International Search Report for PCT/JP2022/007746 mailed on May 10, 2022.
Japanese Office Action for 2023-506912 mailed on Apr. 9, 2024.

*Primary Examiner* — Phuong Chi Thi Nguyen
(74) *Attorney, Agent, or Firm* — IPUSA, PLLC

(57) ABSTRACT

A rotary connector includes a stator, a rotor, main flexible substrates, and a wiring member. The main flexible substrates are disposed on the wiring member in a state where the main flexible substrates are stacked one on another at an end portion of each main flexible substrate. An end portion of a first main flexible substrate on a side near the wiring member has a shape that does not overlap one or more of second connection terminals to each of which a first connection terminal of second main flexible substrate on a side distant from the wiring member is connected.

10 Claims, 25 Drawing Sheets

(56) References Cited

U.S. PATENT DOCUMENTS

| | | | |
|---|---|---|---|
| 6,966,787 B2 * | 11/2005 | Schilson | H01B 7/0018 |
| | | | 174/117 FF |
| 7,104,821 B2 * | 9/2006 | Araki | B60R 16/027 |
| | | | 439/164 |
| 9,557,192 B2 * | 1/2017 | Siler | G01B 11/27 |
| 2002/0115312 A1 | 8/2002 | Matsuzaki et al. | |
| 2004/0067670 A1 | 4/2004 | Rhein et al. | |
| 2008/0316255 A1 | 12/2008 | Kubo et al. | |
| 2019/0067892 A1 | 2/2019 | Asakura et al. | |
| 2019/0297726 A1 | 9/2019 | Yazaki et al. | |

FOREIGN PATENT DOCUMENTS

| | | |
|---|---|---|
| JP | 2009-004419 | 1/2009 |
| WO | 2017/208544 | 12/2017 |
| WO | 2018/123414 | 7/2018 |

* cited by examiner

FIG.10B
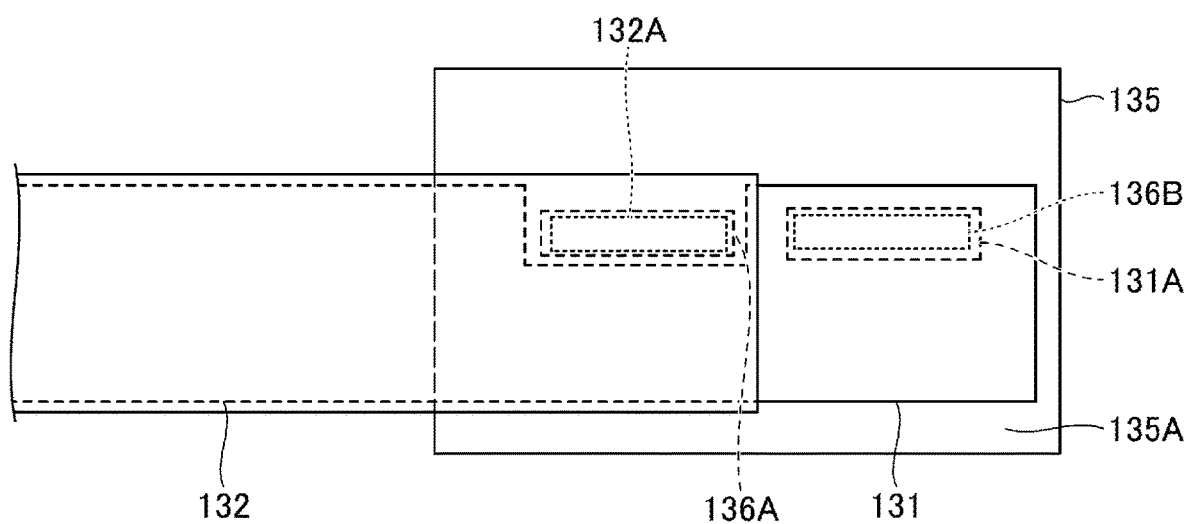
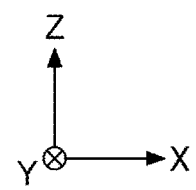

FIG.15B
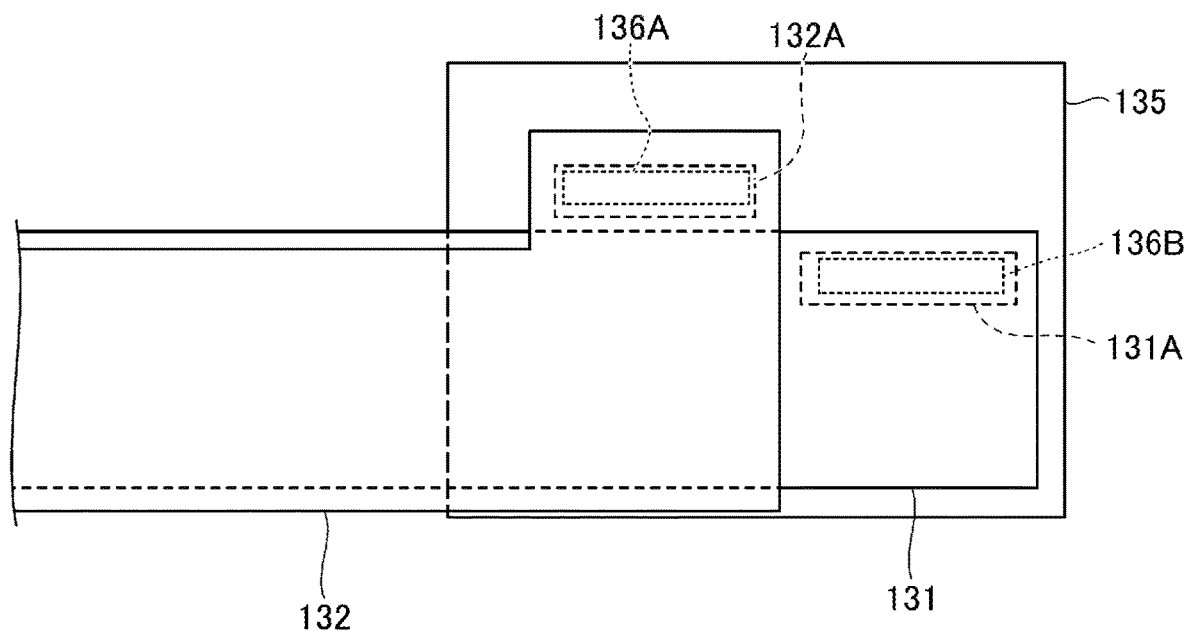
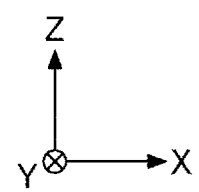

ROTARY CONNECTOR

CROSS-REFERENCE TO RELATED APPLICATIONS

This application is a continuation application of International Application No. PCT/JP2022/007746, filed on Feb. 24, 2022, and designating the U.S., which is based upon and claims priority to Japanese Patent Application No. 2021-041406, filed on Mar. 15, 2021, the entire contents of which are incorporated herein by reference.

BACKGROUND

1. Field of the Invention

The present disclosure relates to a rotary connector.

2. Description of the Related Art

Conventionally, in a vehicle such as an automobile, a technique for electrically connecting various electric components (for example, a switch, a sensor, and the like. Hereinafter, referred to as "steering-side electric components") provided in a steering wheel and various electric components (for example, an electronic control unit (ECU) and the like. Hereinafter, referred to as "vehicle-side electrical components") provided in a vehicle body, by the rotary connector provided between the steering wheel and a vehicle body has been used.

In general, in such a rotary connector, a flexible substrate for electrically connecting electric components on a stator side and electric components on a rotor side is accommodated in an annular space between the stator and the rotor.

For example, Patent Document 1 below discloses a technique in which three flex cables are stacked and connected to one lead frame in a clock spring connector.

RELATED-ART DOCUMENT

Patent Document

[Patent Document 1] Published Translation of PCT International Application No. 2006-502549

In the technique disclosed in Patent Document 1, it is necessary to bond flex cables to a lead frame in order from the flex cable of the lower layer. Therefore, in the technique disclosed in Patent Document 1, there is a possibility that the number of work processes for bonding the plurality of flex cables to the lead frame increases and becomes complicated.

SUMMARY

A rotary connector according to one embodiment includes a stator and a rotor provided to be rotatable relative to the stator. The rotary connector includes a plurality of main flexible substrates accommodated in an annular space between the stator and the rotor, each main flexible substrate of the plurality of main flexible substrates including a first connection terminal provided at an end portion of the main flexible substrate. The rotary connector includes a wiring member including a plurality of second connection terminals to each of which the first connection terminal of a respective one of the plurality of main flexible substrates is connected. The plurality of main flexible substrates are disposed on the wiring member in a state where the plurality of main flexible substrates are stacked one on another at the end portion of each main flexible substrate. The plurality of main flexible substrates include a first main flexible substrate on a side near the wiring member, and include a second main flexible substrate on a side distant from the wiring member. The end portion of the first main flexible substrate has a shape that does not overlap, in a plan view, one or more of the second connection terminals to each of which the first connection terminal of the second main flexible substrate is connected.

BRIEF DESCRIPTION OF THE DRAWINGS

FIGS. 10A and 10B are diagrams illustrating a configuration example of the connecting portion of a connecting cable in the rotary connector in a first modification of the embodiment.

FIGS. 15A and 15B are diagrams illustrating a configuration example of the connecting portion of the connecting cable in the rotary connector a sixth modification of the embodiment.

DETAILED DESCRIPTION

One or more embodiments of the present disclosure will be described below with reference to the drawings. In the following description, a direction parallel to a rotation center axis AX1 is referred to as a Z-axis direction, and directions perpendicular to the rotation center axis AX1 are referred to as an X-axis direction and a Y-axis direction. However, a longitudinal direction of a holding surface 151A which will be described later is also referred to as the X-axis direction.

Overview of Rotary Connector 10

Figure 1:
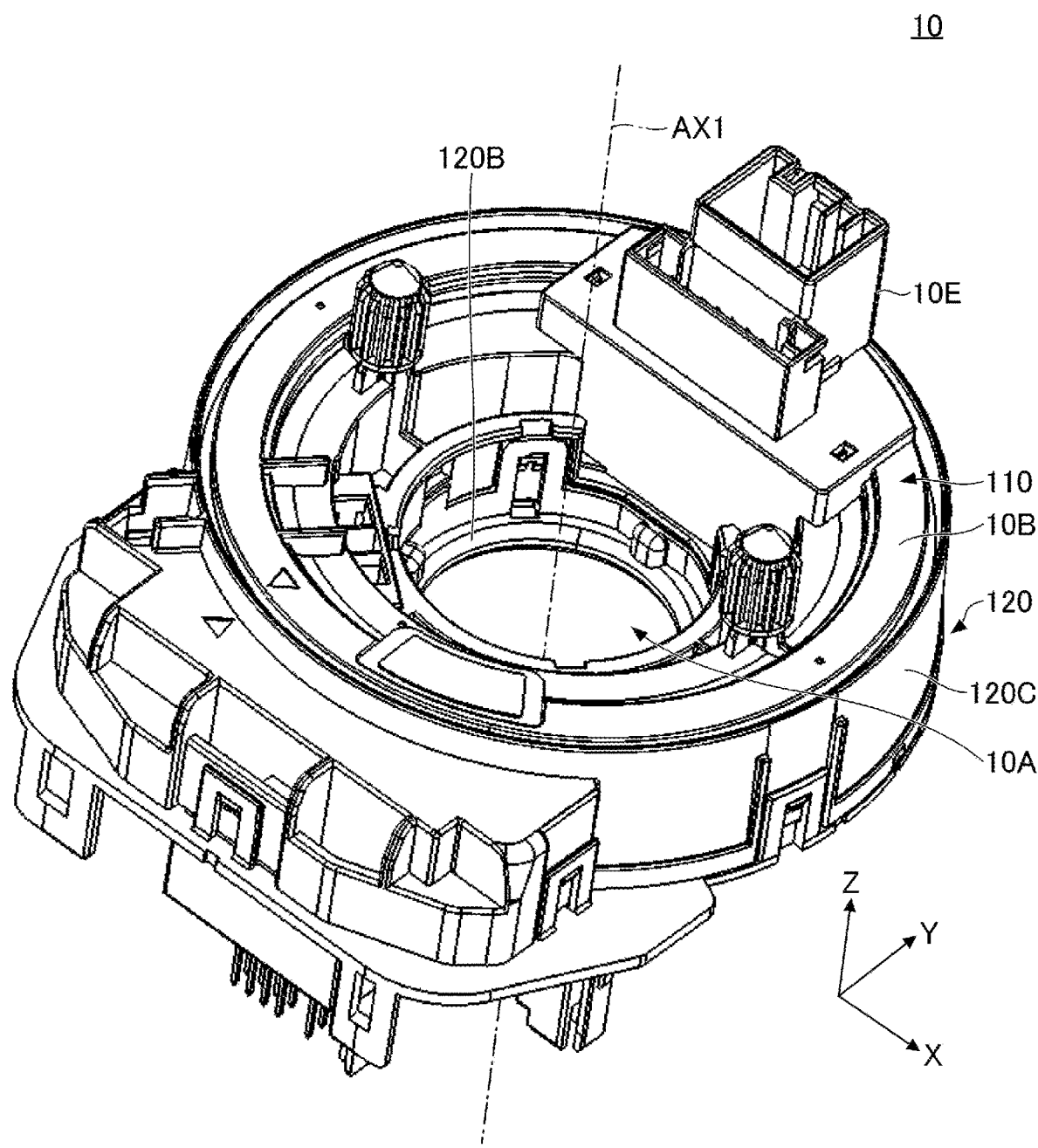
FIGS. 1 and 2 are external perspective views of a rotary connector according to an embodiment.
Figure 2:
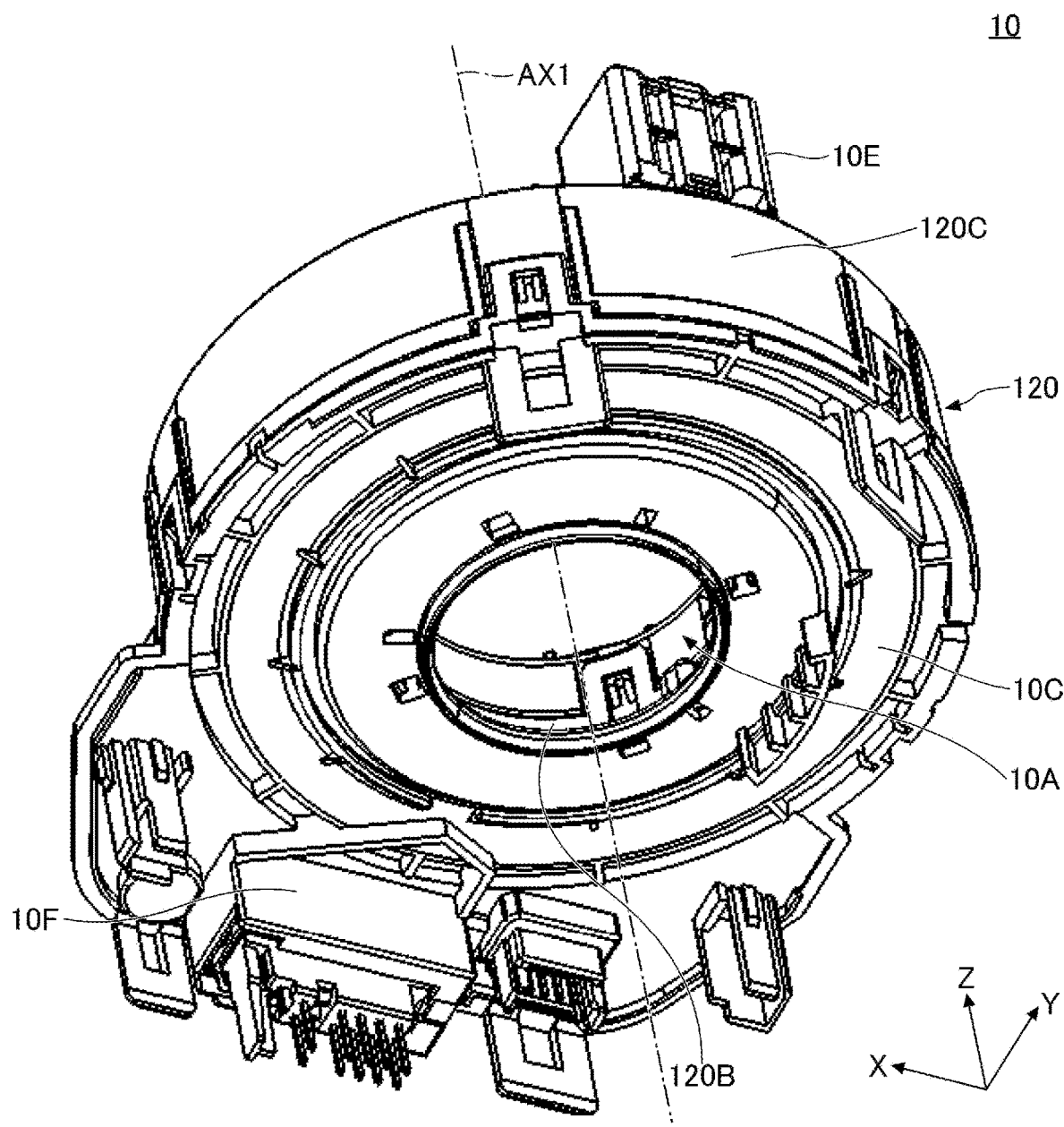

FIG. 1 and FIG. 2 are external perspective views of a rotary connector 10 according to an embodiment. The rotary connector 10 illustrated in FIG. 1 and FIG. 2 is incorporated in a steering device of a vehicle such as an automobile to electrically connect various steering-side electric components (for example, a paddle switch, various operation switches, an airbag, various detection sensors, a vibration generator, a heater, and the like) provided in a steering wheel to various vehicle-side electric components (for example, an ECU, and the like) provided in a vehicle body.

As illustrated in FIG. 1 and FIG. 2, the rotary connector 10 has a generally thin cylindrical shape. At the cylindrical center of the rotary connector 10, a cylindrical through hole 10A extending along the rotation center axis AX1 is formed. A steering shaft is inserted into the through hole 10A.

The rotary connector 10 includes a rotor 110 and a stator 120. The rotor 110 is a disk-shaped member that is provided so as to be rotatable relative to the stator 120 and rotates integrally with the steering wheel. The rotor 110 has a connection surface 10B (see FIG. 1) that is connected to the steering wheel directly or indirectly via another member. The connection surface 10B is a flat surface having a substantially circular shape, and a central portion thereof is opened in a circular shape by the through hole 10A. A connector 10E is provided on the connection surface 10B so as to protrude toward the steering wheel. The connector 10E is electrically connected to the steering wheel by being fitted into a connector provided in the steering wheel.

The stator 120 is a substantially cylindrical member fixed to the vehicle body. The stator 120 has an annular space 120A (see FIG. 3) between an inner cylindrical portion 120B and an outer cylindrical portion 120C. A connection cable 130 (see FIG. 3) is accommodated in the annular space 120A. The connection cable 130 is a flexible strip-shaped cable. An opening of the annular space 120A on the steering wheel side is closed by the rotor 110 rotatably provided in the opening. The stator 120 has a connection surface 10C (see FIG. 2) that is connected to the vehicle body directly or indirectly via another member. The connection surface 10C is a flat surface having a substantially circular shape, and a central portion thereof is opened in a circular shape by the through hole 10A. A connector 10F is provided on the connection surface 10C so as to protrude toward the vehicle body side. The connector 10F is electrically connected to the vehicle body by being fitted into a connector provided in the vehicle body.

The connector 10E provided on the connection surface 10B and the connector 10F provided on the connection surface 10C are electrically connected to each other by the connection cable 130 accommodated in the rotary connector 10.

The rotary connector 10 is configured such that the connection surface 10B of the rotor 110 is rotatable relative to the connection surface 10C of the stator 120 about the rotation center axis AX1. Thereby, when rotational operation of the steering wheel is performed in a state where the rotary connector 10 is incorporated in the steering device, the connection surface 10B to which the steering wheel is attached can be rotated together with the steering wheel while the connection surface 10C is fixed to the vehicle body. Thus, the rotary connector 10 can electrically connect the steering-side electrical components to the vehicle-side electrical components without interfering with the rotational operation of the steering wheel.

Internal Configuration of Stator 120

Figure 3:
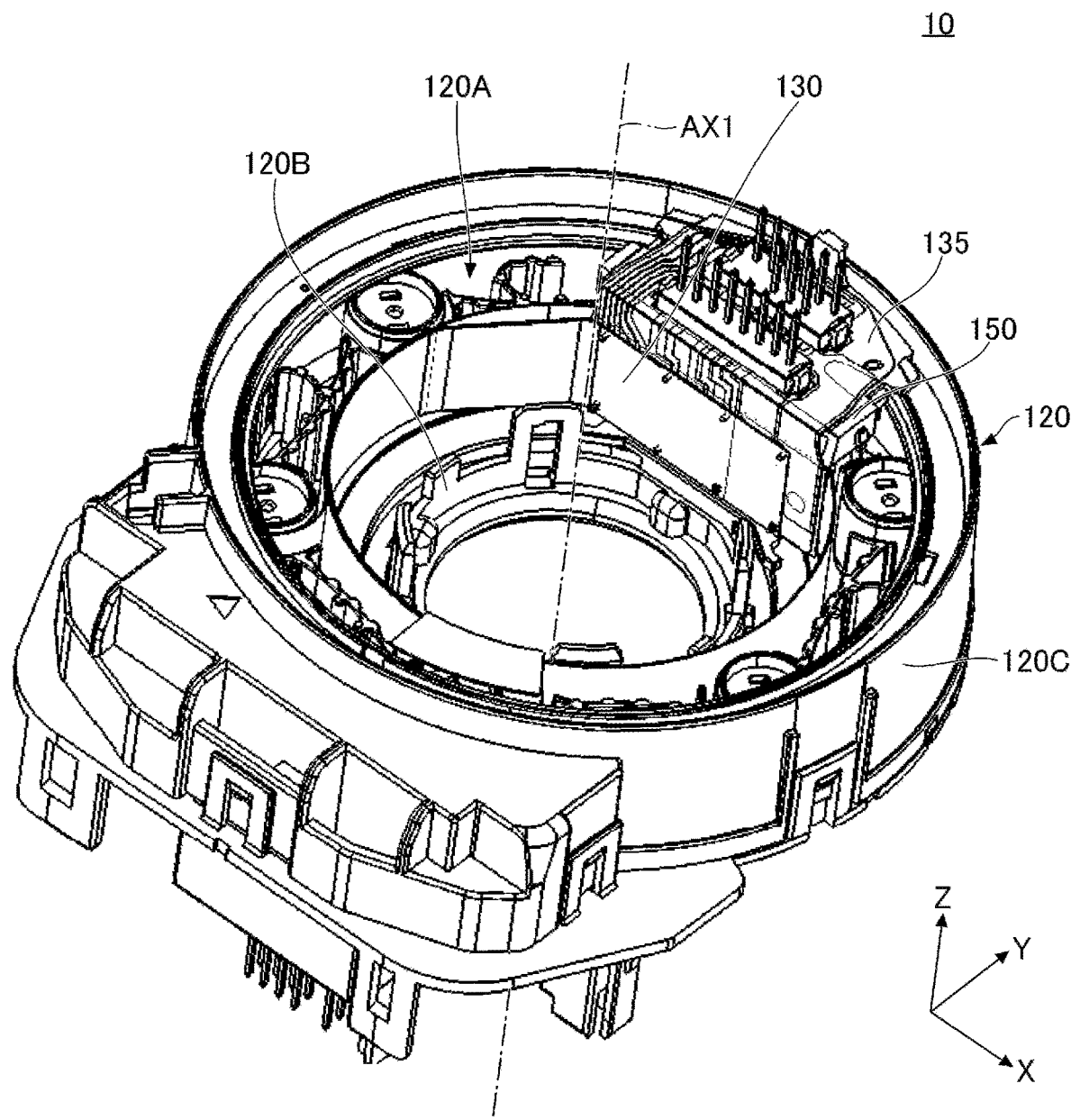
FIG. 3 is an external perspective view of the rotary connector (with a rotor removed) according to the embodiment.
Figure 4:
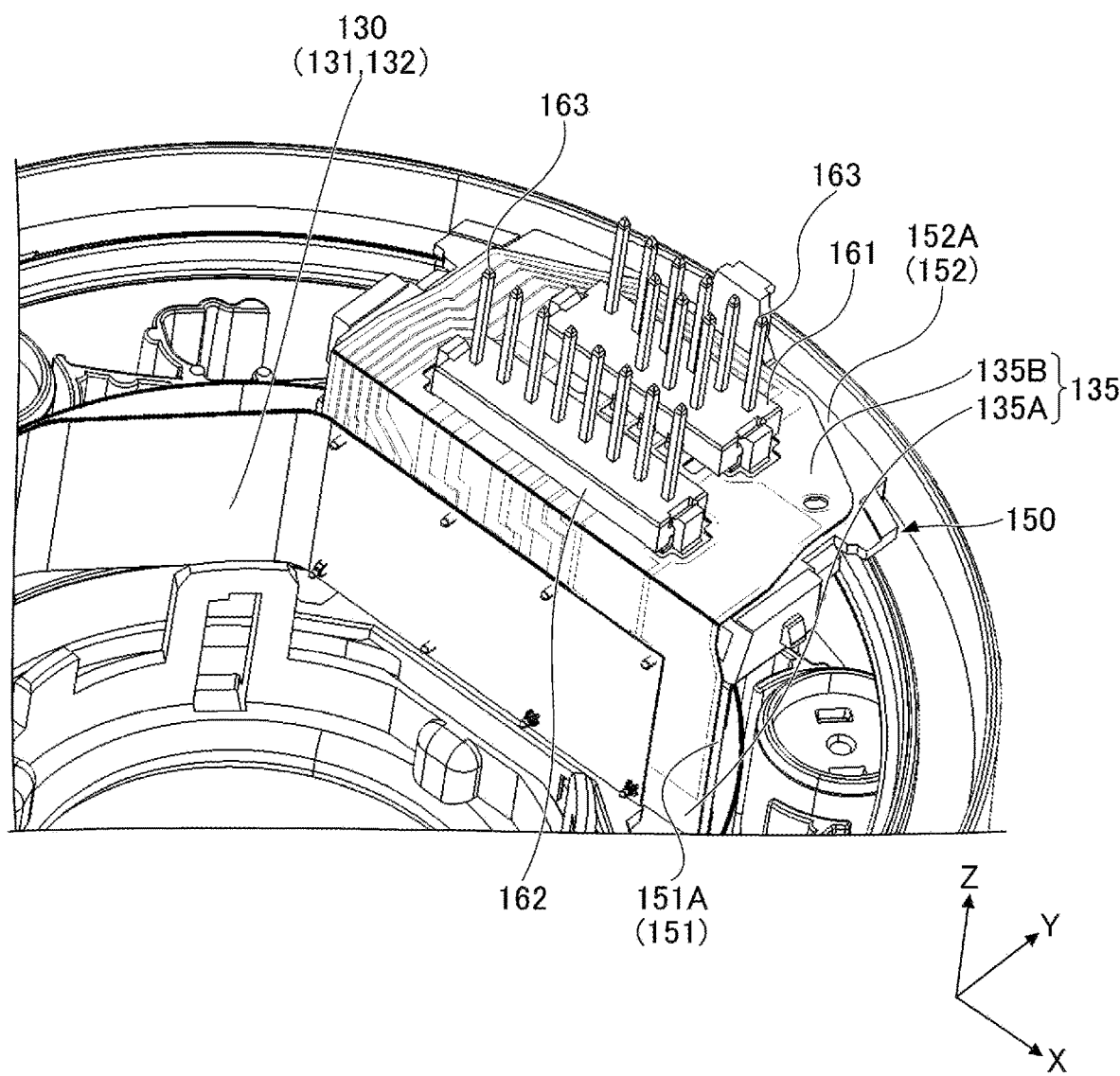
FIG. 4 is a partially enlarged perspective view of the rotary connector illustrated in FIG. 3.

FIG. 3 is an external perspective view of the rotary connector 10 (in a state where the rotor 110 is removed) according to the embodiment. FIG. 4 is a partially enlarged perspective view of the rotary connector 10 illustrated in FIG. 3.

As illustrated in FIG. 3 and FIG. 4, inside the annular space 120A of the stator 120, the flexible strip-shaped connection cable 130 is accommodated so as to extend in the circumferential direction. The connection cable 130 is configured by stacking two main flexible substrates 131 and 132 (an example of a "plurality of main flexible substrate"). Each of the main flexible substrates 131 and 132 is a band-shaped wiring component having flexibility. For example, the main flexible substrates 131 and 132 are formed by covering both surfaces on which strip-shaped conductor wiring (for example, copper foil, or the like) is formed with a material (for example, polyimide resin, polyethylene terephthalate (PET), or the like) having flexibility and insulation properties.

As illustrated in FIG. 3 and FIG. 4, an end portion of the connection cable 130 is connected to a sub-flexible substrate 135 which is an example of a "wiring member". In the rotary connector 10 according to the embodiment, since the sub-flexible substrate 135 is provided separately from the connection cable 130, the end portion of the connection cable 130 can be a rectangular shape and enlarged to a large area by the sub-flexible substrate 135. Furthermore, the wiring member to which the end portion of the connection cable 130 is connected may have a structure in which wiring is held by an insulating member such as resin.

As illustrated in FIG. 3 and FIG. 4, the sub-flexible substrate 135 includes a first planar portion 135A parallel to the rotation center axis AX1 and a second planar portion 135B perpendicular to the rotation center axis AX1, and has a shape that is bent at a substantially right angle toward the outer side in the radial direction.

The first planar portion 135A is disposed near the inner cylindrical portion 120B of the stator 120. The sub-flexible substrate 135 is electrically connected to one end of the connection cable 130 by solder connection in a state of stacking the one end of the connection cable 130 on the first planar portion 135A.

The second planar portion 135B is provided so as to extend from the upper end portion of the first planar portion 135A toward the outer side (that is, the outer cylindrical portion 120C side) in the radial direction of a circle centered on the rotation center axis AX1. Lead blocks 161 and 162 constituting the connector 10E are provided on the upper surface of the second planar portion 135B. On the upper surface of each of the lead blocks 161 and 162, external connection terminals 163 are erected so as to extend in parallel with the rotation center axis AX1.

As illustrated in FIG. 3 and FIG. 4, the rotary connector 10 according to the embodiment includes a holding member 150 that holds the sub-flexible substrate 135 from the rear surface side (vehicle body side) thereof. Similar to the sub-flexible substrate 135, the holding member 150 has a shape that is bent at a substantially right angle toward the outer side in the radial direction. For example, the holding member 150 is formed using a resin material. As illustrated in FIG. 3 and FIG. 4, the holding member 150 includes a first holding portion 151 and a second holding portion 152.

The first holding portion 151 is a flat plate-shaped portion parallel to the rotation center axis AX1. The first holding portion 151 is disposed in proximity to the inner cylindrical portion 120B of the stator 120. The first holding portion 151 has a holding surface 151A facing the rotation center axis AX1 side. The holding surface 151A holds the first planar portion 135A of the sub-flexible substrate 135 from the back surface side thereof.

The second holding portion 152 is a flat plate-shaped portion perpendicular to the rotation center axis AX1. The second holding portion 152 is provided so as to extend from the upper end portion of the first holding portion 151 toward the outer side (that is, the outer cylindrical portion 120C side) in the radial direction of the circle centered on the rotation center axis AX1. The second holding portion 152 has a holding surface 152A facing the steering wheel side. The holding surface 152A holds the second planar portion 135B of the sub-flexible substrate 135 from the back surface side thereof.

Configuration of Connection Portion of Connection Cable 130

Figure 5:
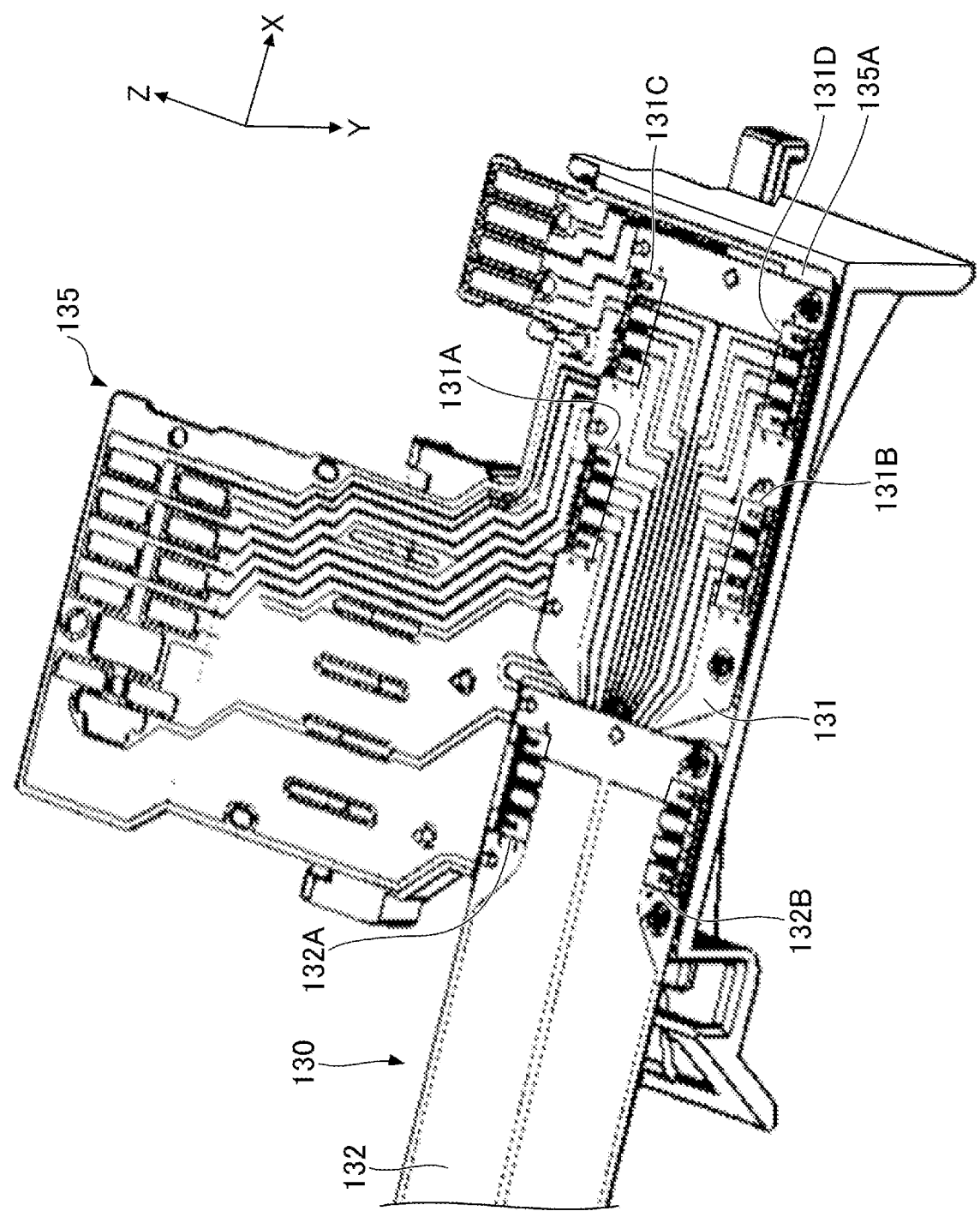
FIG. 5 is an external perspective view illustrating a configuration of a connection portion of a connection cable in the rotary connector according to the embodiment.
Figure 6:
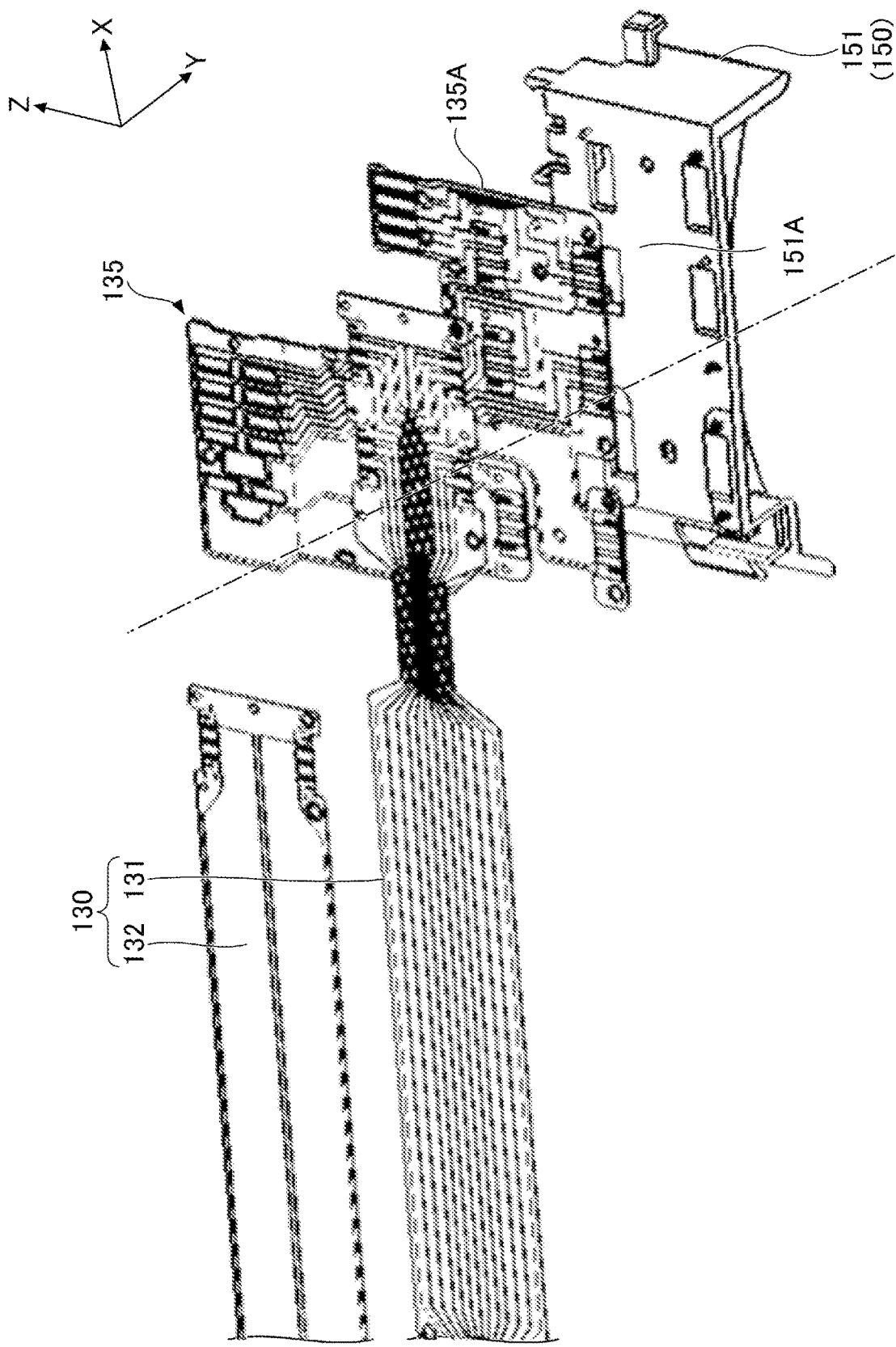
FIG. 6 is an exploded perspective view illustrating the configuration of the connection portion of the connection cable in the rotary connector according to the embodiment.
Figure 7:
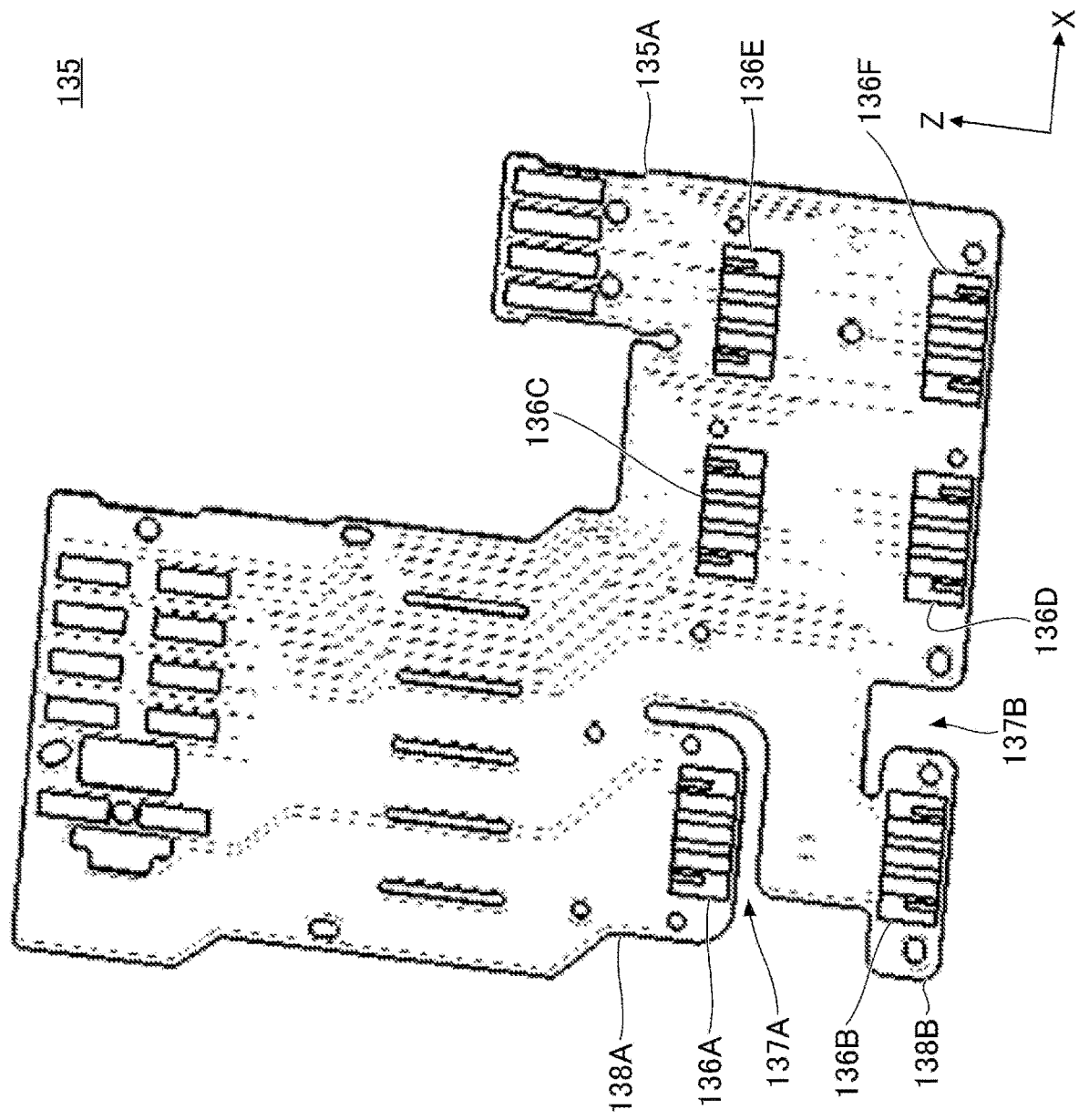
FIG. 7 is an external perspective view of a sub-flexible substrate included in the rotary connector according to the embodiment.
Figure 8:
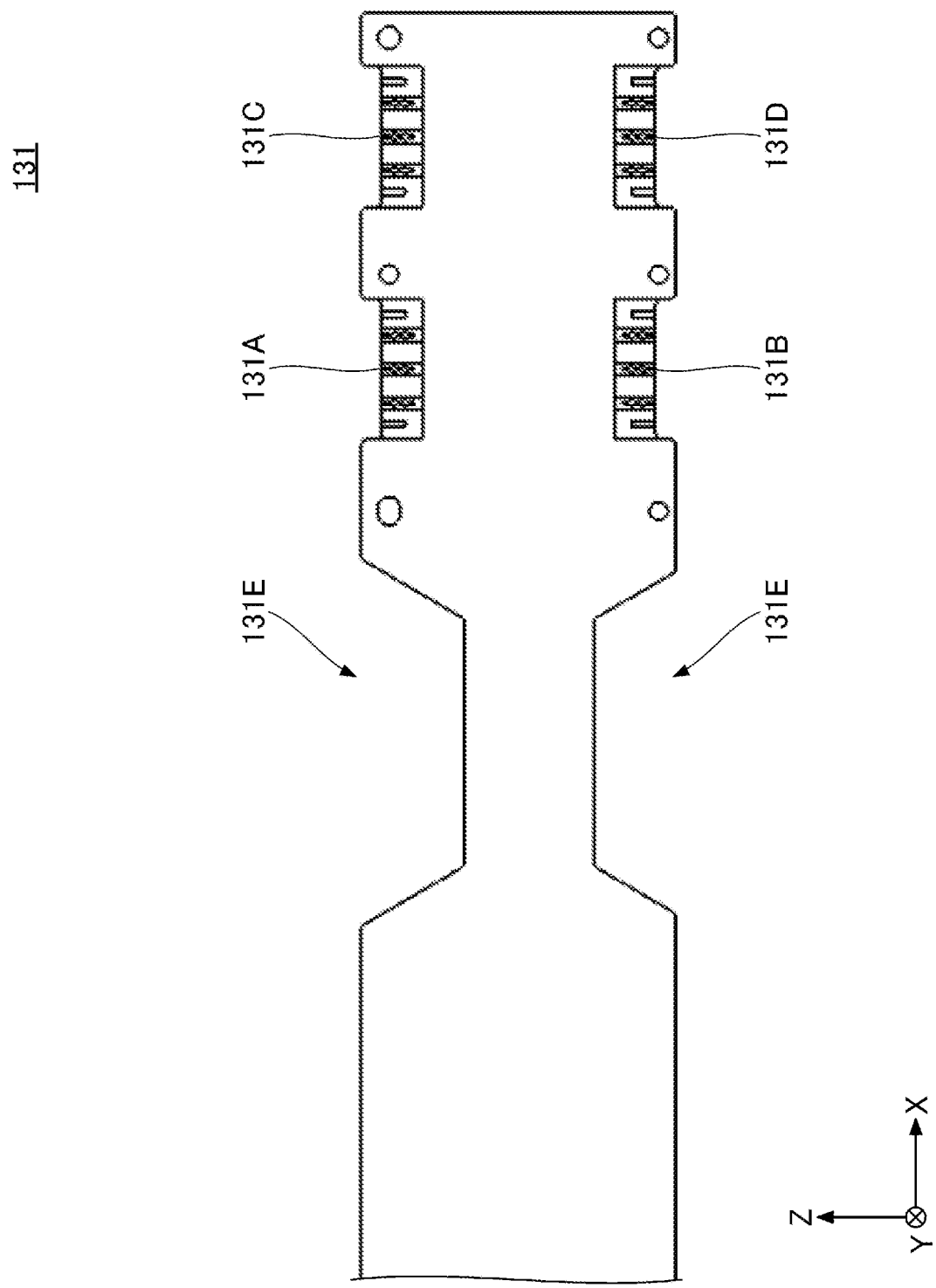
FIG. 8 is a plan view of an end portion of a main flexible substrate included in the rotary connector according to the embodiment.
Figure 9:
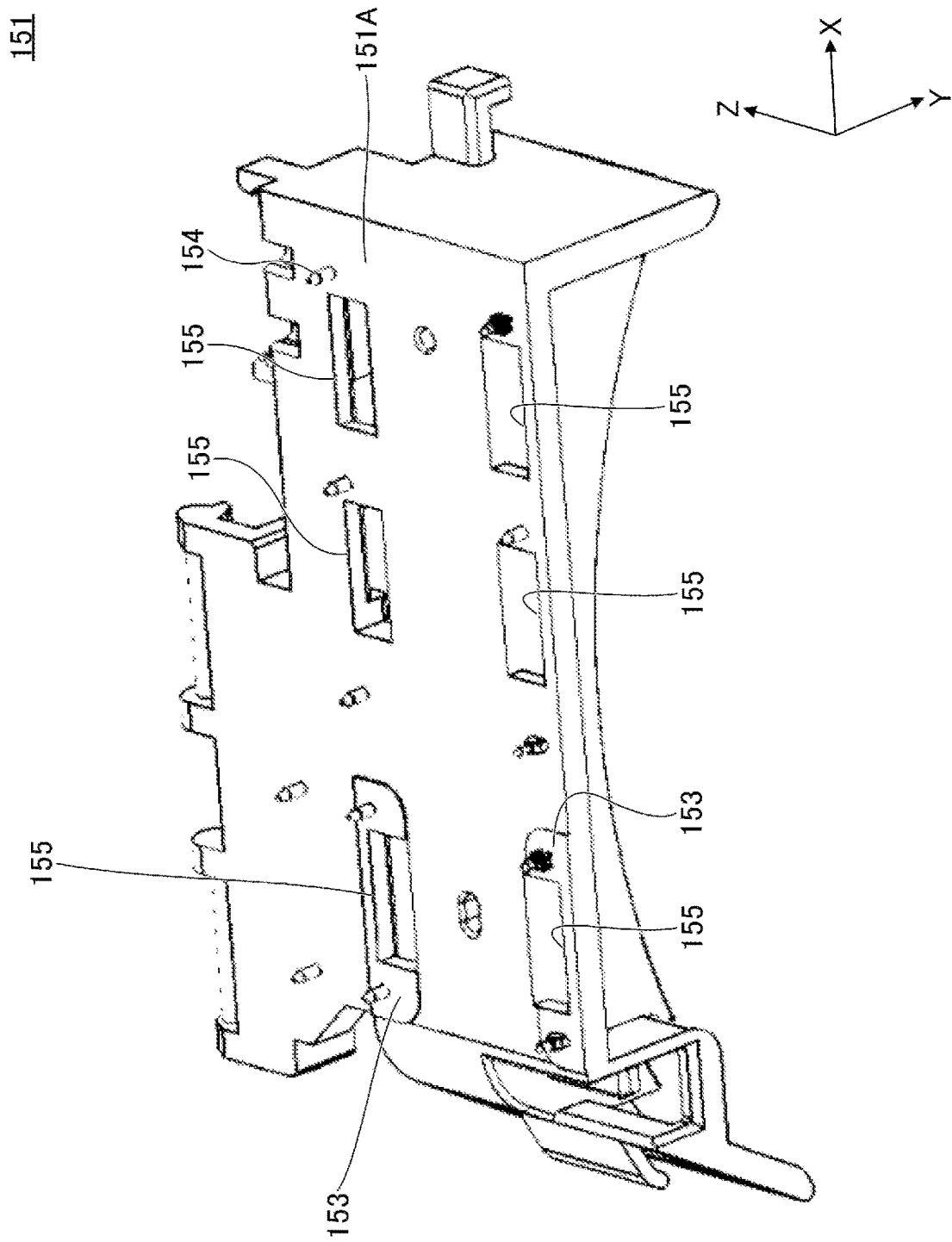
FIG. 9 is an external perspective view of a holding member included in the rotary connector according to the embodiment.

Hereinafter, a configuration of a connection portion of the connection cable 130 will be described with reference to FIG. 5 to FIG. 9. FIG. 5 is an external perspective view illustrating a configuration of a connection portion of the connection cable 130 in the rotary connector 10 according to the embodiment. FIG. 6 is an exploded perspective view illustrating the configuration of the connection portion of the connection cable 130 in the rotary connector 10 according to the embodiment. FIG. 7 is an external perspective view of the sub-flexible substrate 135 included in the rotary connector 10 according to the embodiment. FIG. 8 is a plan view of an end portion of the main flexible substrate 131 included in the rotary connector 10 according to the embodiment. FIG. 9 is an external perspective view of the holding member 150 included in the rotary connector 10 according to the embodiment.

As illustrated in FIG. 5, the connection cable 130 has a configuration in which end portions of the two main flexible substrates 131 and 132 are stacked one on another. The two main flexible substrates 131 and 132 are stacked one on another, and connected to the first planar portion 135A of the sub-flexible substrate 135 in a state where the stacked substrates 131 and 132 are further stacked on the first planar portion 135A so as to be routed out from one end side (X-axis negative side) thereof in the longitudinal direction. The first planar portion 135A is held by the holding surface 151A of the first holding portion 151 constituting the holding member 150 from the back surface side thereof.

In the rotary connector 10 according to the embodiment, since the connection cable 130 includes the two main flexible substrates 131 and 132, the number of wires of the connection cable 130 can be increased in response to an increase in the number of steering-side electrical components without increasing the width of the connection cable 130.

As illustrated in FIG. 5, first connection terminals 131A, 131B, 131C, and 131D are provided at the end portion of the main flexible substrate 131.

At the end portion of the main flexible substrate 131, the first connection terminals 131A and 131B are provided on the main body side (X-axis negative side) of the main flexible substrate 131. The first connection terminals 131A and 131B are provided to face each other in the widthwise direction of the main flexible substrate 131 (the direction parallel to the rotation center axis AX1 (the Z-axis direction)).

At the end portion of the main flexible substrate 131, the first connection terminals 131C and 131D are provided on the tip end side (X-axis positive side) of the main flexible substrate 131. The first connection terminals 131C and 131D are provided to face each other in the widthwise direction of the main flexible substrate 131.

The first connection terminals 131A and 131C are provided in proximity to one edge (the edge on the Z-axis positive side) of the main flexible substrate 131 in the widthwise direction of the main flexible substrate 131.

The first connection terminals 131B and 131D are provided in proximity to the other edge (the edge on the Z-axis negative side) of the main flexible substrate 131 in the widthwise direction of the main flexible substrate 131.

As illustrated in FIG. 5, first connection terminals 132A and 132B are provided at the end portion of the main flexible substrate 132. The first connection terminals 132A and 132B are provided to face each other in the widthwise direction of the main flexible substrate 132 (the direction parallel to the rotation center axis AX1 (the Z-axis direction)).

The first connection terminal 132A is provided in proximity to one edge (the edge on the Z-axis positive side) of the main flexible substrate 132 in the widthwise direction of the main flexible substrate 132.

The first connection terminal 132B is provided in proximity to the other edge (the edge on the Z-axis negative side) of the main flexible substrate 132 in the widthwise direction of the main flexible substrate 132.

As illustrated in FIG. 7, second connection terminals 136A, 136B, 136C, 136D, 136E, and 136F are provided on the first planar portion 135A of the sub-flexible substrate 135.

The second connection terminals 136A and 136B are provided on one end side (end portion on the side from which the connection cable 130 is routed out (X-axis negative side)) of the first planar portion 135A in the direction orthogonal to the rotation center axis AX1 (X-axis direction). Furthermore, the second connection terminals 136A and 136B are provided to face each other in a direction parallel to the rotation center axis AX1 (Z-axis direction). The second connection terminal 136A is provided at a location overlapping the first connection terminal 132A of the main flexible substrate 132, and is connected to the first connection terminal 132A by solder connection. The second connection terminal 136B is provided at a location overlapping the first connection terminal 132B of the main flexible substrate 132, and is connected to the first connection terminal 132B by solder connection.

The second connection terminals 136C and 136D are provided at a central portion of the first planar portion 135A in a direction orthogonal to the rotation center axis AX1 (X-axis direction). Furthermore, the second connection terminals 136C and 136D are provided to face each other in a direction parallel to the rotation center axis AX1 (Z-axis direction). The second connection terminal 136C is provided at a location overlapping the first connection terminal 131A of the main flexible substrate 131, and is connected to the first connection terminal 131A by solder connection. The second connection terminal 136D is provided at a location overlapping the first connection terminal 131B of the main flexible substrate 131, and is connected to the first connection terminal 131B by solder connection.

The second connection terminals 136E and 136F are provided on the other end side (end portion on the opposite side of the side from which the connection cable 130 is routed out (X-axis positive side)) of the first planar portion 135A in the direction orthogonal to the rotation center axis AX1 (X-axis direction). Furthermore, the second connection terminals 136E and 136F are provided to face each other in a direction parallel to the rotation center axis AX1 (Z-axis direction). The second connection terminal 136E is provided at a location overlapping the first connection terminal 131C of the main flexible substrate 131, and is connected to the first connection terminal 131C by solder connection. The second connection terminal 136F is provided at a location overlapping the first connection terminal 131D of the main flexible substrate 131, and is connected to the first connection terminal 131D by solder connection.

Here, the connection cable 130 has a configuration in which the end portions of the main flexible substrates 131 and 132 are stacked one on another so that the end portion of the main flexible substrate 131 is a lower layer (an example of a "main flexible substrate on a side near the wiring member") and the end portion of the main flexible substrate 132 is an upper layer (an example of a "main flexible substrate on a side distant from the wiring member"). The end portion of the upper layer main flexible substrate 132 is connected to each of the second connection terminals 136A and 136B provided at one end portion (end portion on the X-axis negative side) in the longitudinal direction (X-axis direction) of the first planar portion 135A. On the other hand, the end portion of the lower layer main flexible substrate 131 is connected to each of the second connection terminals 136C to 136F provided at the central portion and the other end portion (end portion on the X-axis positive side) in the longitudinal direction (X-axis direction) of the first planar portion 135A. Therefore, in the direction orthogonal to the rotation center axis AX1 (X-axis direction), the length of the end portion of the lower layer main flexible substrate 131 is longer than that of the end portion of the main flexible substrate 132 that is the upper layer.

Furthermore, as illustrated in FIG. 8, the end portion of the lower layer main flexible substrate 131 has a pair of avoidance portions 131E having a shape to avoid the second connection terminals 136A and 136B to which the end portion of the upper layer main flexible substrate 132 is connected. In the present embodiment, each avoidance portion 131E has a shape that is cut out inward from each of both edges the main flexible substrate 131 in the widthwise direction (Z-axis direction) thereof.

Accordingly, when the lower layer main flexible substrate 131 is disposed so as to stack on the sub-flexible substrate 135, the lower layer main flexible substrate 131 can partially uncover each of the second connection terminals 136A and 136B to which the upper layer main flexible substrate 132 is connected. As a result, each of the second connection terminals 136A and 136B is partially covered only with the main flexible substrate 132 that is connected to each of the second connection terminals 136A and 136B.

Accordingly, in the rotary connector 10 according to the embodiment, the first connection terminals 132A and 132B of the upper layer main flexible substrate 132 can be soldered to the second connection terminals 136A and 136B of the sub-flexible substrate 135, respectively, while the upper layer main flexible substrate 132 is stacked on the lower layer main flexible substrate 131.

Furthermore, in the rotary connector 10 according to the embodiment, each of the first connection terminals 131A to 131D of the lower layer main flexible substrate 131 and each of the first connection terminals 132A and 132B of the upper layer main flexible substrate 132 can be simultaneously soldered to each of the corresponding second connection terminals 136A to 136F while the upper layer main flexible substrate 132 is stacked on the lower layer main flexible substrate 131.

Therefore, according to the rotary connector 10 of the embodiment, when the plurality of main flexible substrates 131 and 132 are bonded to the sub-flexible substrate 135 in a state of being stacked one on another, it is possible to suppress the number of work processes and work process complication.

Furthermore, in the rotary connector 10 according to the embodiment, since the main flexible substrates 131 and 132 can be routed out from the sub-flexible substrate 135 in the same direction, it is possible to increase the degree of freedom in wiring arrangement of the main flexible substrates 131 and 132.

Furthermore, in the rotary connector 10 according to the embodiment, since the pair of avoidance portions 131E having a shape cut out inward in the widthwise direction are provided in a part of the belt-shaped main flexible substrate 131 having a substantially constant width, the main flexible substrate 131 can be partially avoided to overlap the second connection terminals 136A and 136B provided on the sub-flexible substrate 135 without reducing the number of main flexible substrates 131 taken from the original sheet.

Base Portion 153

As illustrated in FIG. 9, on the holding surface 151A of the first holding portion 151 constituting the holding member 150, a pair of base portions 153 are provided at locations overlapping the respective avoidance portions 131E of the lower layer main flexible substrate 131 (that is, locations where the second connection terminals 136A and 136B are disposed). Each base portion 153 has substantially the same shape as each avoidance portion 131E in a plan view, and is disposed so as to be accommodated inside the corresponding avoidance portion 131E. The upper surface of each base portion 153 is a flat surface, and the height position thereof is higher than that of the holding surface 151A by a certain height. The height of each base portion 153 is substantially equal to the thickness of the lower layer main flexible substrate 131. Each of the second connection terminals 136A and 136B is disposed on the upper surface of the respective base portions 153. Thus, in each base portion 153, the height position of each of the second connection terminals 136A and 136B can be partially made substantially equal to the surface height position of the lower layer main flexible substrate 131.

Accordingly, in the rotary connector 10 according to the embodiment, when the upper layer main flexible substrate 132 is stacked on the lower layer main flexible substrate 131, the first connection terminals 132A and 132B of the upper layer main flexible substrate 132 can be prevented from becoming separated from the second connection terminals 136A and 136B of the sub-flexible substrate 135. Therefore, the rotary connector 10 according to the embodiment can stably solder the first connection terminals 132A and 132B to the second connection terminals 136A and 136B.

Furthermore, the rotary connector 10 according to the embodiment can, even after the first connection terminals 132A and 132B are soldered, suppress the occurrence of stress that causes the first connection terminals 132A and 132B to be separated from the second connection terminals 136A and 136B.

As illustrated in FIG. 7, slits 137A and 137B are formed in the first planar portion 135A of the sub-flexible substrate 135. Thus, tongue portions 138A and 138B are formed on the first planar portion 135A, and the tongue portions 138A and 138B can be partially bent. The tongue portion 138A includes the second connection terminal 136A, and the tongue portion 138B includes the second connection terminal 136B. Thus, in the rotary connector 10 according to the embodiment, when the height positions of the second connection terminals 136A and 136B are raised by the pair of base portions 153, by partially bending the tongue portions 138A and 138B, the occurrence of distortion or the like in the sub-flexible substrate 135 can be suppressed, thereby performing stable solder connection.

As illustrated in FIG. 9, cylindrical pins 154 are erected on the holding surface 151A of the first holding portion 151. On the other hand, as illustrated in FIG. 5 to FIG. 8, in each of the main flexible substrates 131 and 132 and the sub-flexible substrate 135, circular openings are formed at locations corresponding to each of the plurality of pins 154. Each of the plurality of pins 154 is caulked in a state of being fitted into the corresponding opening of either the main flexible substrates 131, 132 or the sub-flexible substrate 135. Thus, the main flexible substrates 131 and 132 and the sub-flexible substrate 135 are accurately located and fixed to the holding surface 151A in a state where they are stacked one on another.

Furthermore, in the rotary connector 10 according to the embodiment, the main flexible substrate 131 is disposed in the lower layer and the main flexible substrate 132 is disposed in the upper layer, however, the main flexible substrate 131 may be disposed in the upper layer and the main flexible substrate 132 may be disposed in the lower layer. Also, in such a case, in the rotary connector 10 according to the embodiment, each of the first connection terminals 131A to 131D of the upper layer main flexible substrate 131 and each of the first connection terminals 132A and 132B of the lower layer main flexible substrate 132 can be simultaneously soldered to each of the corresponding second connection terminals 136A to 136F in a state where the main flexible substrates 131 and 132 are stacked one on another.

As illustrated in FIG. 9, opening portions 155 are formed in the holding surface 151A of the first holding portion 151 at locations where each of the second connection terminals 136A to 136F is arranged. Each of the opening portions 155 enables the respective unit of the second connection terminals 136 to be fixed by a jig from the back side of the first holding portion 151 when the second connection terminals 136 are soldered.

MODIFICATIONS

Hereinafter, modifications of the configuration of the connection portion of the connection cable 130 will be described with reference to FIG. 10A to FIG. 17C. As illustrated in FIG. 10A to FIG. 17C, the configuration of the connection portion of the connection cable 130 may have any configuration as long as the end portions of the plurality of main flexible substrates constituting the connection cable 130 are arranged on the sub-flexible substrate 135 so as to stack one on another, and the end portion of one of the two main flexible substrates does not overlap, in a plan view, the second connection terminals to which the first connection terminals of the other main flexible substrate are connected.

First Modification

Figure 10A:
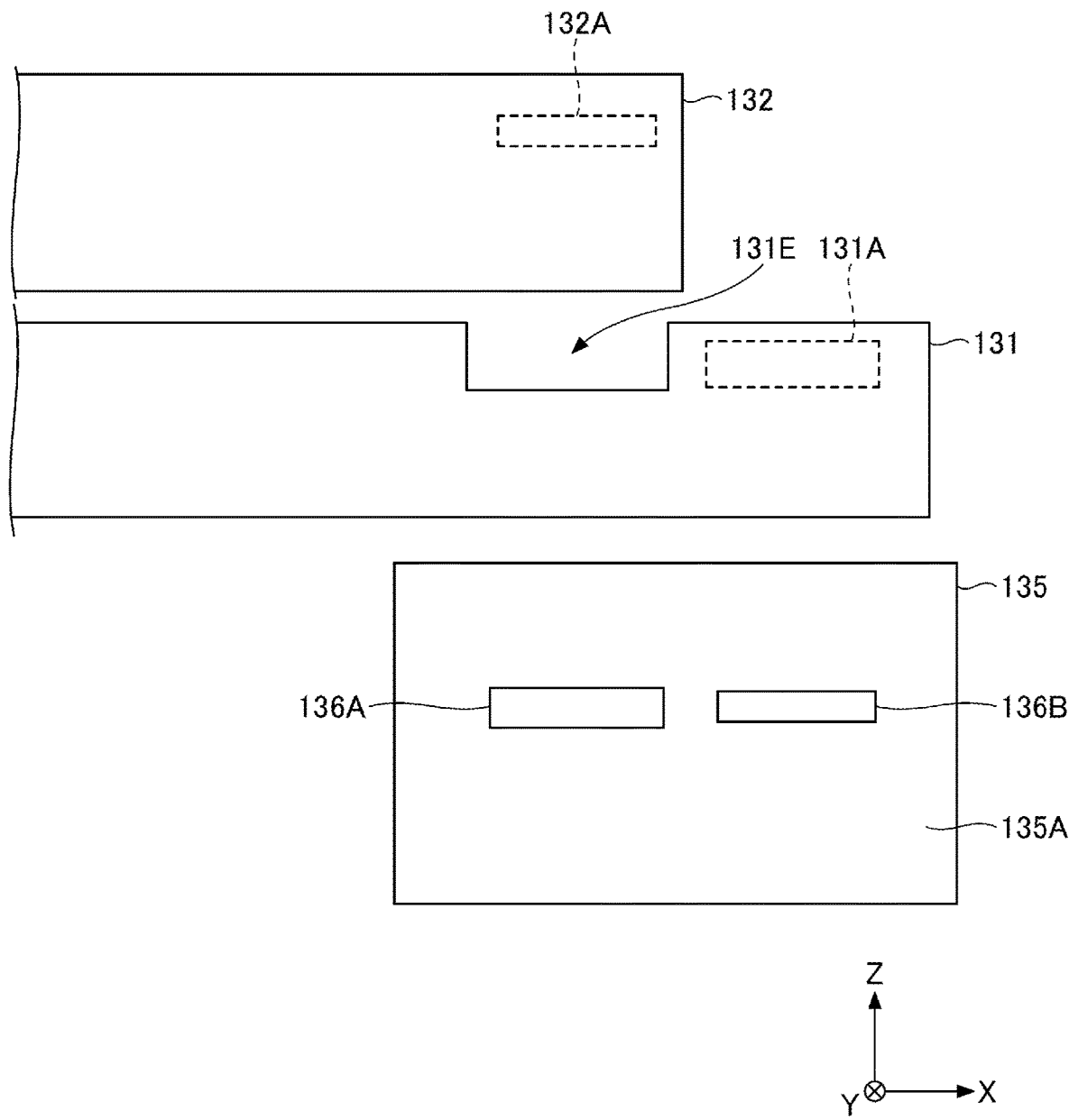

FIG. 10A and FIG. 10B are diagrams illustrating a configuration example of the connection portion of the connection cable 130 in the rotary connector 10 in a first modification of the embodiment. FIG. 10A illustrates the main flexible substrates 131 and 132 and the sub-flexible substrate 135 according to the first modification in a state where they are not stacked one on another. FIG. 10B illustrates the main flexible substrates 131 and 132 and the sub-flexible substrate 135 according to the first modification in a state where they are stacked one on another.

In the first modification, as illustrated in FIG. 10A, the second connection terminals 136A and 136B are provided on the first planar portion 135A of the sub-flexible substrate 135 so as to be arranged in the longitudinal direction of the first planar portion 135A (X-axis direction).

The first connection terminal 132A is provided in proximity to one edge (the edge on the Z-axis positive side) of the end portion of the upper layer main flexible substrate 132.

The first connection terminal 131A is provided in proximity to one edge (the edge on the Z-axis positive side) of the end portion of the lower layer main flexible substrate 131.

Furthermore, at the end portion of the lower layer main flexible substrate 131, the avoidance portion 131E having a shape that is cut out inward from one edge (the edge on the Z-axis positive side) is formed at a location overlapping the second connection terminal 136A.

As illustrated in FIG. 10B, in the first modification, the end portion of the lower layer main flexible substrate 131 has the avoidance portion 131E, so that the second connection terminal 136A can be prevented from being stacked on when the end portion of the main flexible substrate is stacked on the first planar portion 135A.

Therefore, according to the first modification, as illustrated in FIG. 10B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the first modification, the first connection terminal 132A of the main flexible substrate 132 and the first connection terminal 131A of the main flexible substrate 131 can be simultaneously soldered to the second connection terminals 136A and 136B, respectively.

Second Modification

Figure 11A:
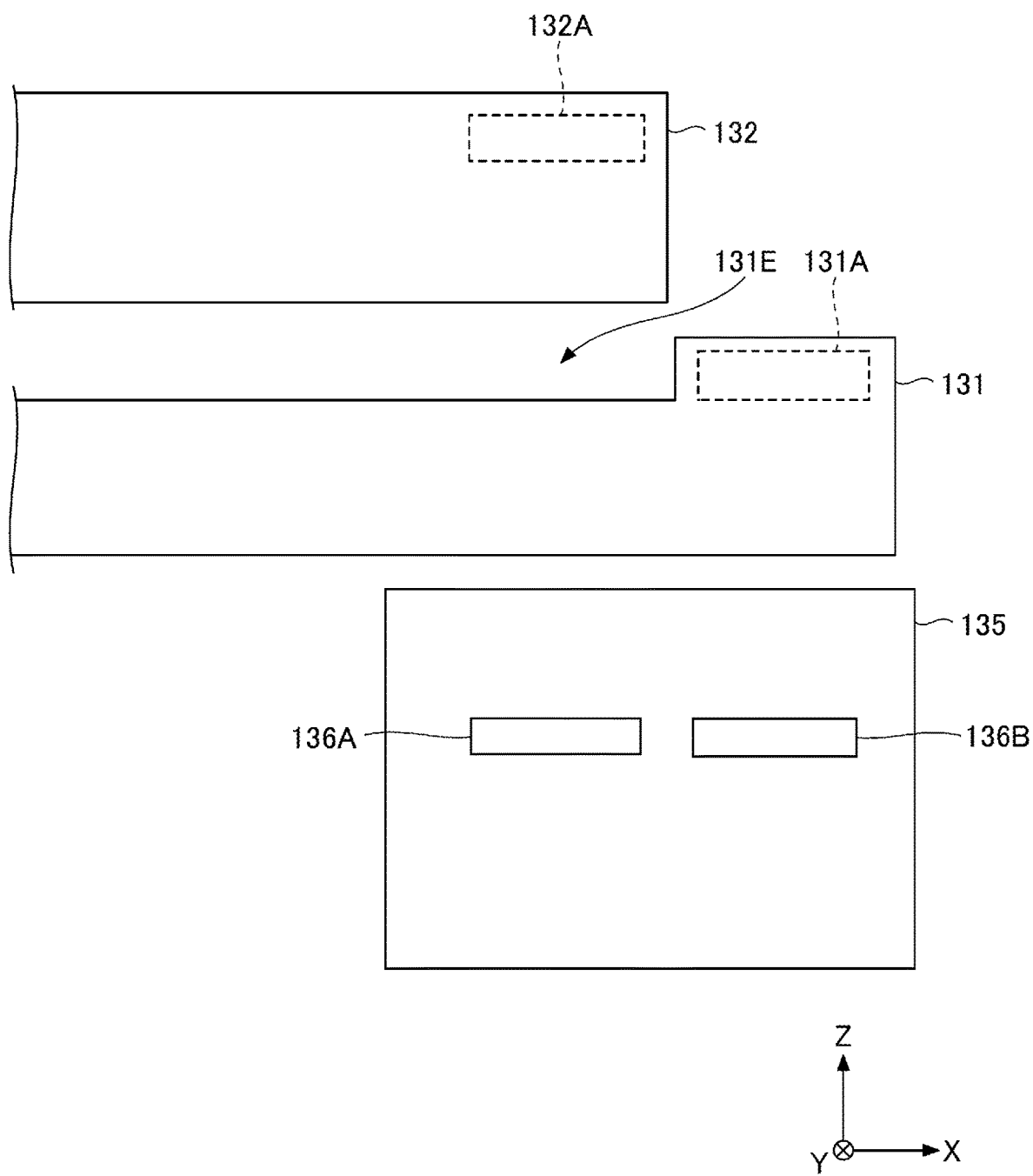
FIGS. 11A and 11B are diagrams illustrating a configuration example of the connecting portion of the connecting cable in the rotary connector in a second modification of the embodiment.
Figure 11B:
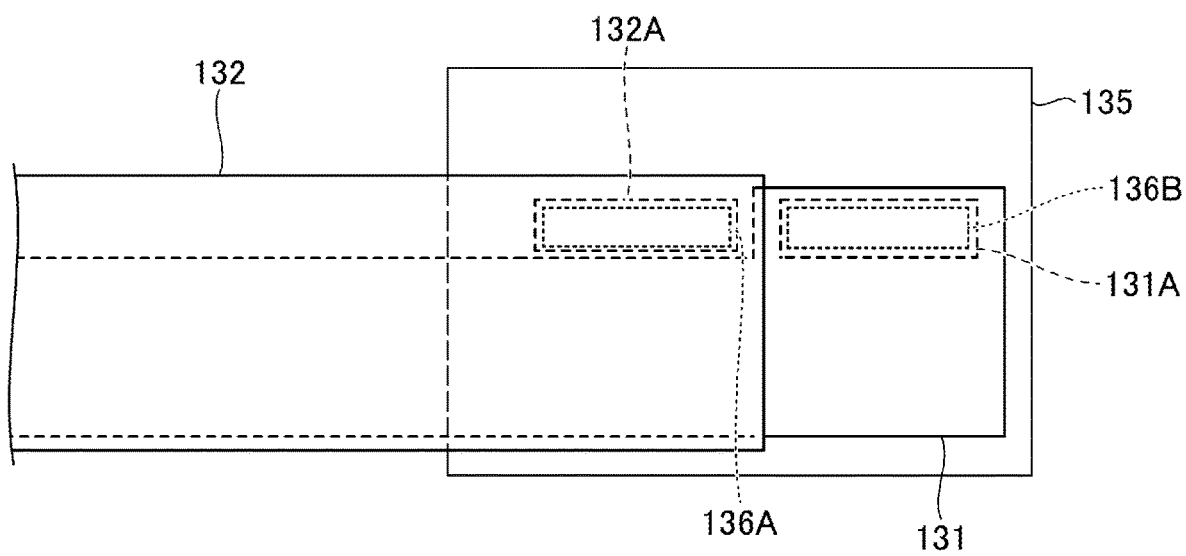

FIG. 11A and FIG. 11B are diagrams illustrating a configuration example of the connection portion of the connection cable 130 in the rotary connector 10 in a second modification of the embodiment. FIG. 11A illustrates the main flexible substrate 131 and 132 and the sub-flexible substrate 135 according to the second modification in a state where they are not stacked one on another. FIG. 11B illustrates the main flexible substrate 131 and 132 and the sub-flexible substrate 135 according to the second modification in a state where they are stacked one on another.

In the second modification, as illustrated in FIG. 11A, the second connection terminals 136A and 136B are provided on the first planar portion 135A of the sub-flexible substrate 135 so as to be arranged in the longitudinal direction of the first planar portion 135A (X-axis direction).

The first connection terminal 132A is provided in proximity to one edge (the edge on the Z-axis positive side) of the end portion of the upper layer main flexible substrate 132.

The first connection terminal 131A is provided in proximity to one edge (the edge on the Z-axis positive side) of the end portion of the lower layer main flexible substrate 131.

At the end portion of the lower layer main flexible substrate 131, the avoidance portion 131E having a shape that is entirely cut out inward from one edge (an edge on the Z-axis positive side) is formed, except for a portion where the first connection terminal 131A is provided. In other words, it can be said that the lower layer main flexible substrate 131 has a shape such that the width thereof is generally narrow and that a portion where the first connection terminal 131A is provided protrudes outward from one edge (the edge on the Z-axis positive side) of the substrate.

As illustrated in FIG. 11B, in the second modification, the end portion of the lower layer main flexible substrate 131 has the avoidance portion 131E, so that the second connection terminal 136A can be prevented from being stacked on when the end portion of the main flexible substrate is stacked on the first planar portion 135A.

Therefore, according to the second modification, as illustrated in FIG. 11B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the second modification, the first connection terminal 132A of the main flexible substrate 132 and the first connection terminal 131A of the main flexible substrate 131 can be simultaneously soldered to the second connection terminals 136A and 136B, respectively.

Third Modification

Figure 12A:
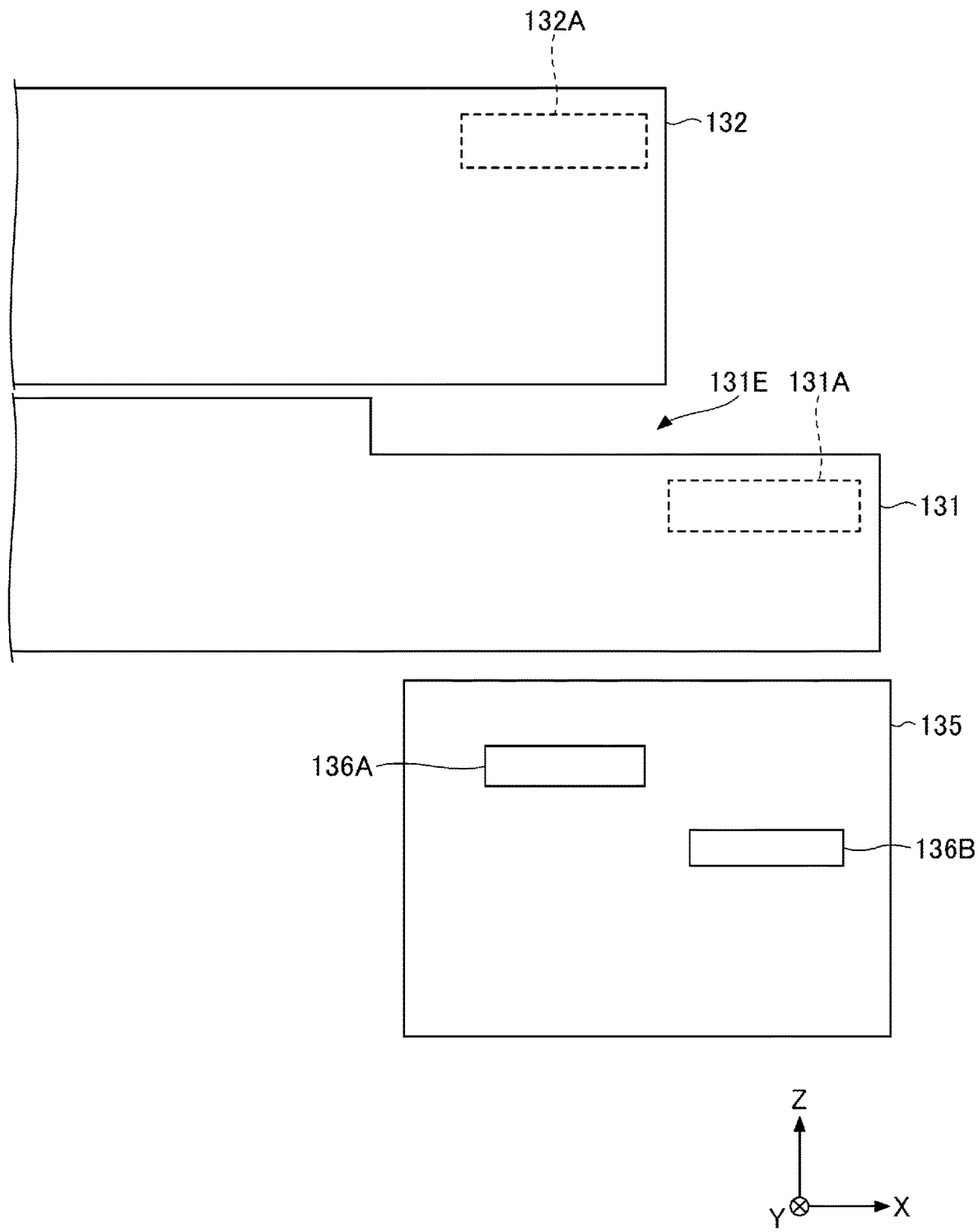
FIGS. 12A and 12B are diagrams illustrating a configuration example of the connecting portion of the connecting cable in the rotary connector in a third modification of the embodiment.
Figure 12B:
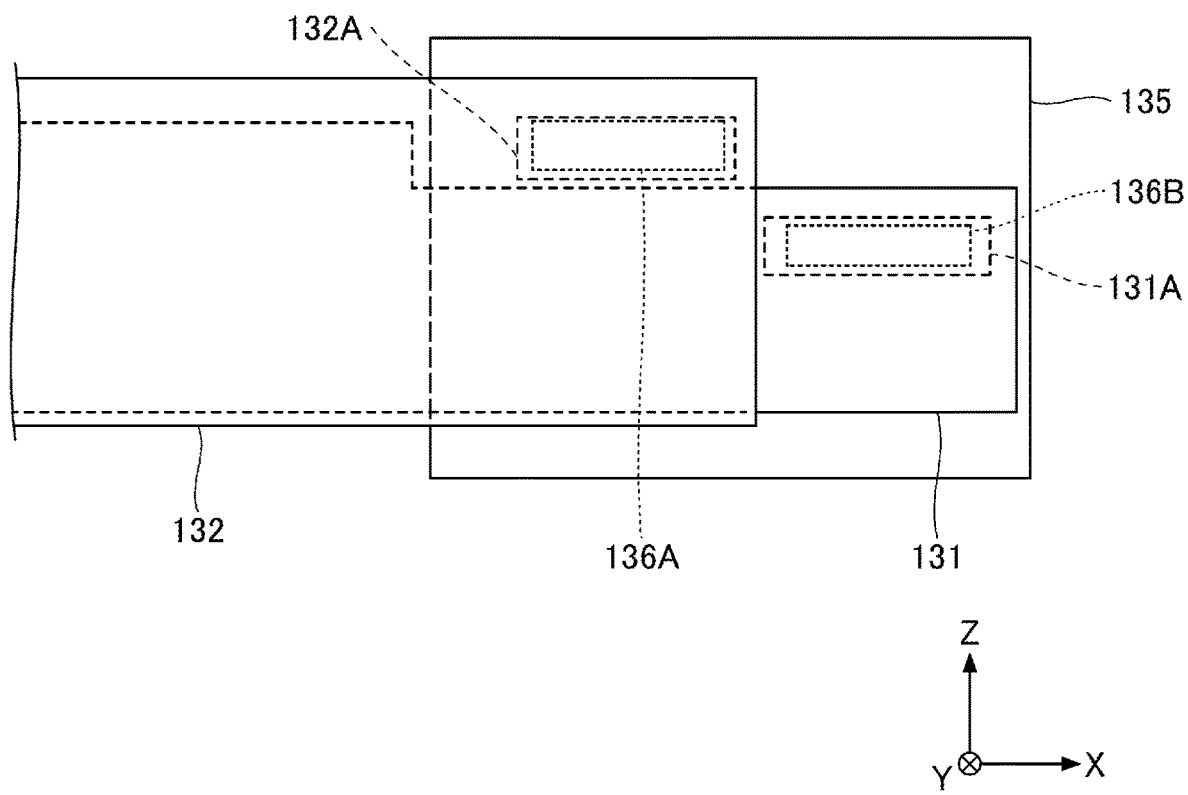

FIG. 12A and FIG. 12B are diagrams illustrating a configuration example of the connection portion of the connection cable 130 in the rotary connector 10 in a third modification of the embodiment. FIG. 12A illustrates the main flexible substrates 131 and 132 and the sub-flexible substrate 135 according to the third modification in a state where they are not stacked one on another. FIG. 12B illustrates the main flexible substrates 131 and 132 and the sub-flexible substrate 135 according to the third modification in a state where they are stacked one on another.

In the third modification, as illustrated in FIG. 12A, the second connection terminals 136A and 136B are provided on the first planar portion 135A of the sub-flexible substrate 135 so as to be arranged in the longitudinal direction of the first planar portion 135A (X-axis direction). The second connection terminal 136B is, however, provided such that the connection terminal 136B is offset towards the Z-axis negative side from the second connection terminal 136A.

The first connection terminal 132A is provided in proximity to one edge (the edge on the Z-axis positive side) of the end portion of the upper layer main flexible substrate 132.

The first connection terminal 131A is provided in proximity to one edge (the edge on the Z-axis positive side) of the end portion of the lower layer main flexible substrate 131.

At the end portion of the lower layer main flexible substrate 131, the avoidance portion 131E having a shape that is entirely cut out inward from one edge (an edge on the Z-axis positive side) is formed. In other words, it can be said that the width of the end portion of the lower layer main flexible substrate 131 is narrower than that of the other portion (main body portion) of the lower layer main flexible substrate 131.

As illustrated in FIG. 12B, in the third modification, the end portion of the lower layer main flexible substrate 131 is narrowed in width by having the avoidance portion 131E, so that the second connection terminal 136A can be prevented from being stacked on when the end portion of the main flexible substrate is stacked on the first planar portion 135A.

Therefore, according to the third modification, as illustrated in FIG. 12B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the third modification, the first connection terminal 132A of the main flexible substrate 132 and the first connection terminal 131A of the main flexible substrate 131 can be simultaneously soldered to the second connection terminals 136A and 136B, respectively.

Fourth Modification

Figure 13A:
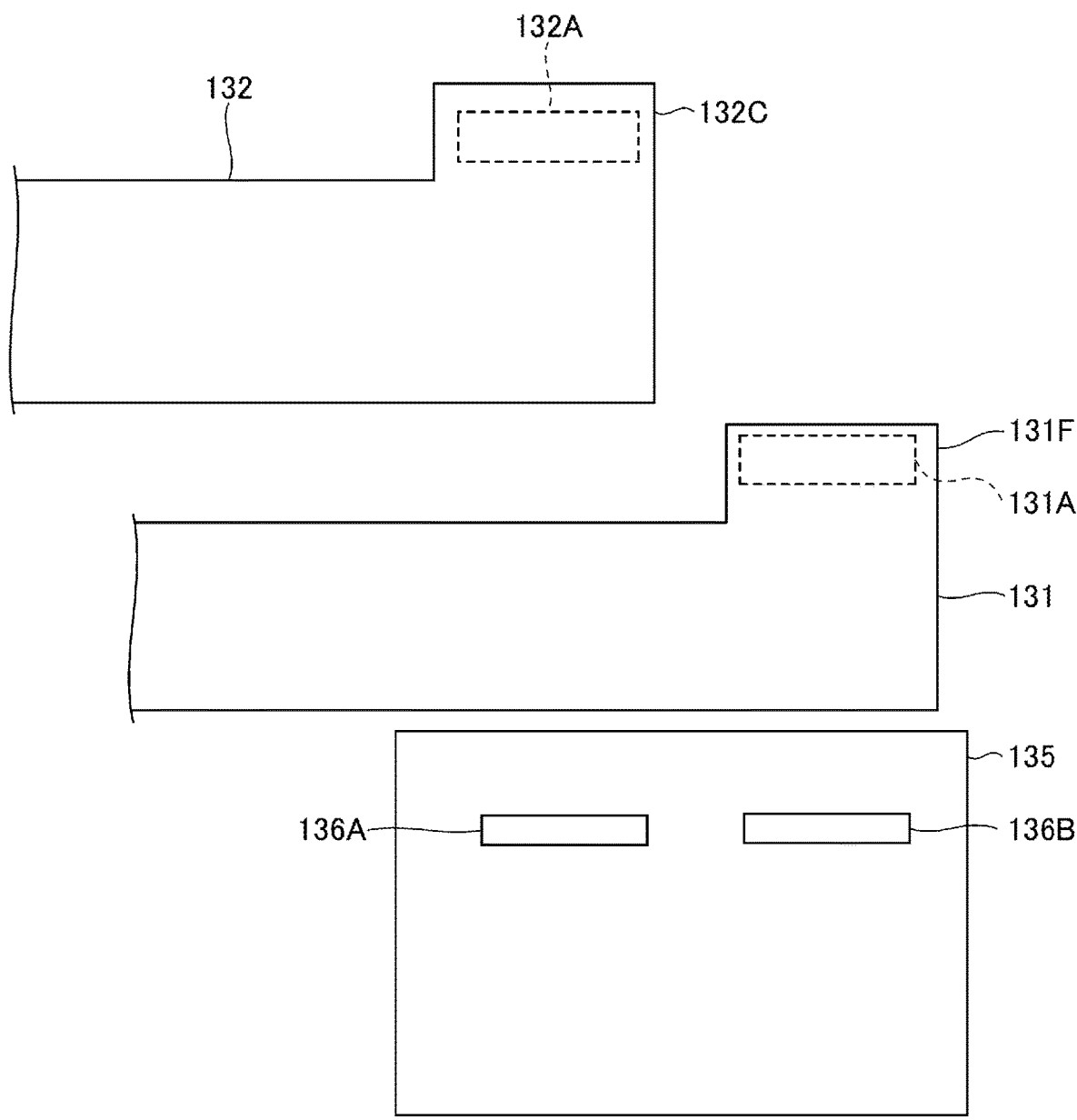
FIGS. 13A and 13B are diagrams illustrating a configuration example of the connecting portion of the connecting cable in the rotary connector in a fourth modification of the embodiment.
Figure 13B:
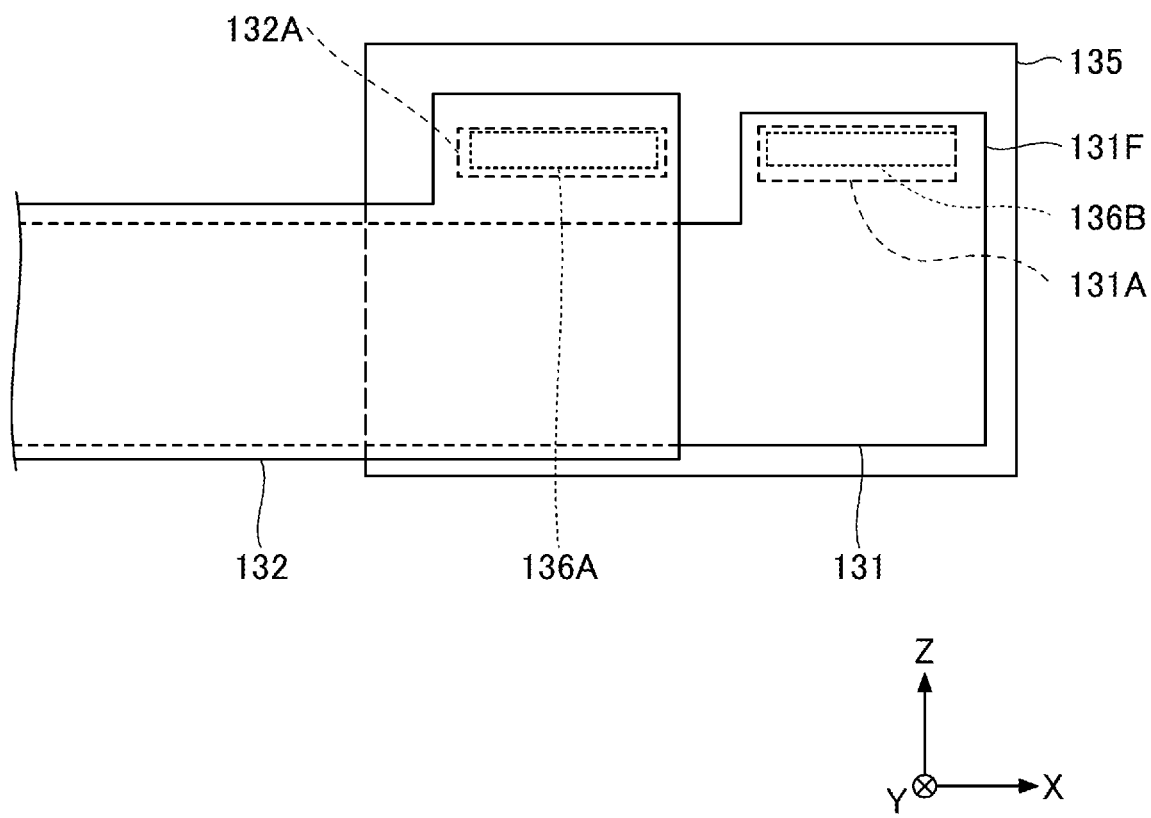

FIG. 13A and FIG. 13B are diagrams illustrating a configuration example of the connection portion of the connection cable 130 in the rotary connector 10 in a fourth modification of the embodiment. FIG. 13A illustrates the main flexible substrates 131 and 132 and the sub-flexible substrate 135 according to the fourth modification in a state where they are not stacked one on another. FIG. 13B illustrates the main flexible substrates 131 and 132 and the sub-flexible substrate 135 according to the fourth modification in a state where they are stacked one on another.

In the fourth modification, as illustrated in FIG. 13A, the second connection terminals 136A and 136B are provided on the first planar portion 135A of the sub-flexible substrate 135 so as to be arranged in the longitudinal direction of the first planar portion 135A (X-axis direction).

A protruding portion 132C that protrudes outward from one edge (edge on the Z-axis positive side) is provided at the end portion of the upper layer main flexible substrate 132. The protruding portion 132C is provided with the first connection terminal 132A.

A protruding portion 131F that protrudes outward from one edge (the edge on the Z-axis positive side) is provided at the end portion of the lower layer main flexible substrate 131. The protruding portion 131F is provided with the first connection terminal 131A.

As illustrated in FIG. 13B, in the fourth modification, the first connection terminal 131A is provided in the protruding portion 131F, so that the second connection terminal 136A can be prevented from being stacked on when the end portion of the main flexible substrate 131 is stacked on the first planar portion 135A.

Therefore, according to the fourth modification, as illustrated in FIG. 13B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the fourth modification, the first connection terminal 132A of the main flexible substrate 132 and the first connection terminal 131A of the main flexible substrate 131 can be simultaneously soldered to the second connection terminals 136A and 136B, respectively.

Fifth Modification

Figure 14A:
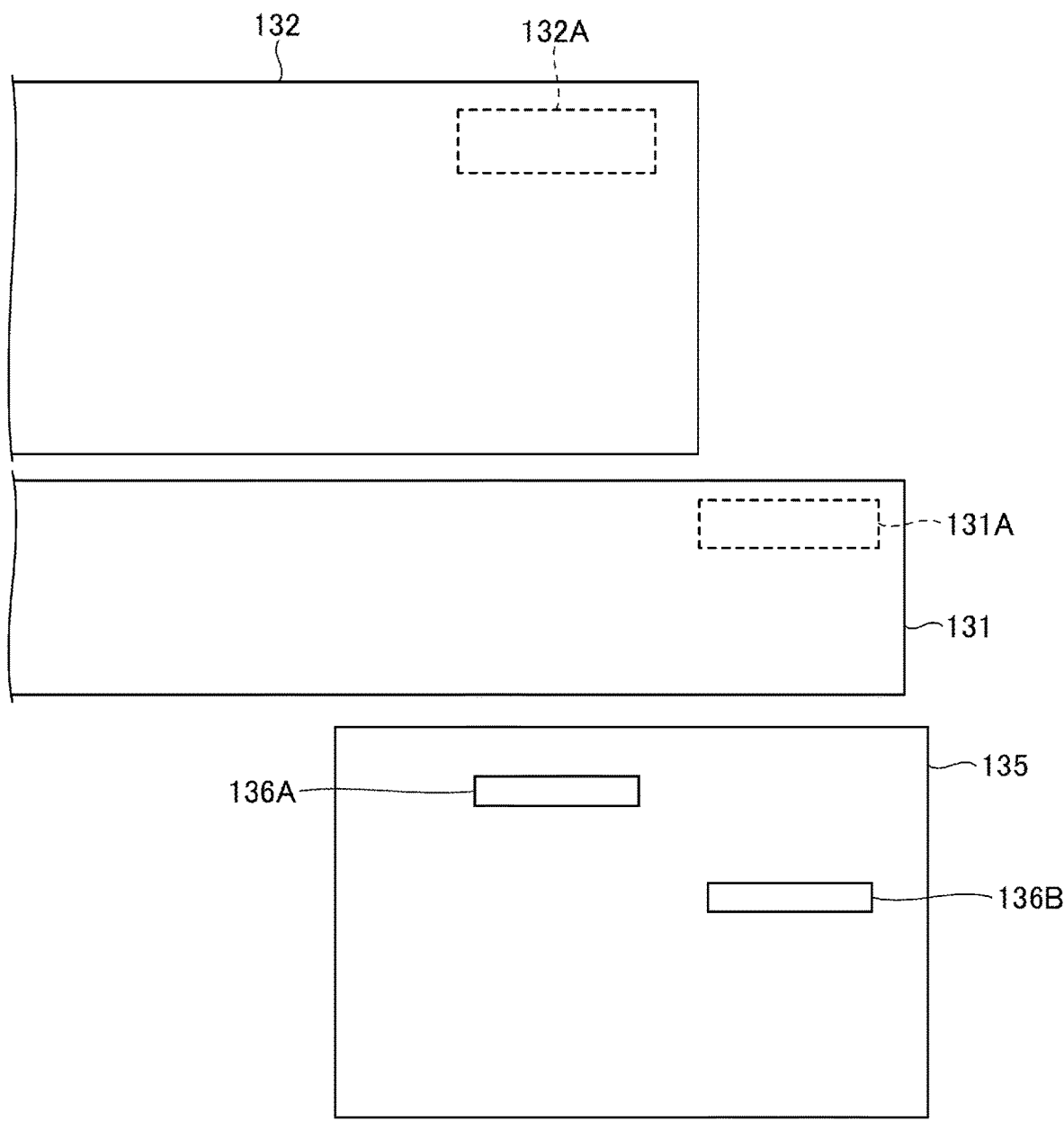
FIGS. 14A and 14B are diagrams illustrating a configuration example of the connecting portion of the connecting cable in the rotary connector in a fifth modification of the embodiment.
Figure 14B:
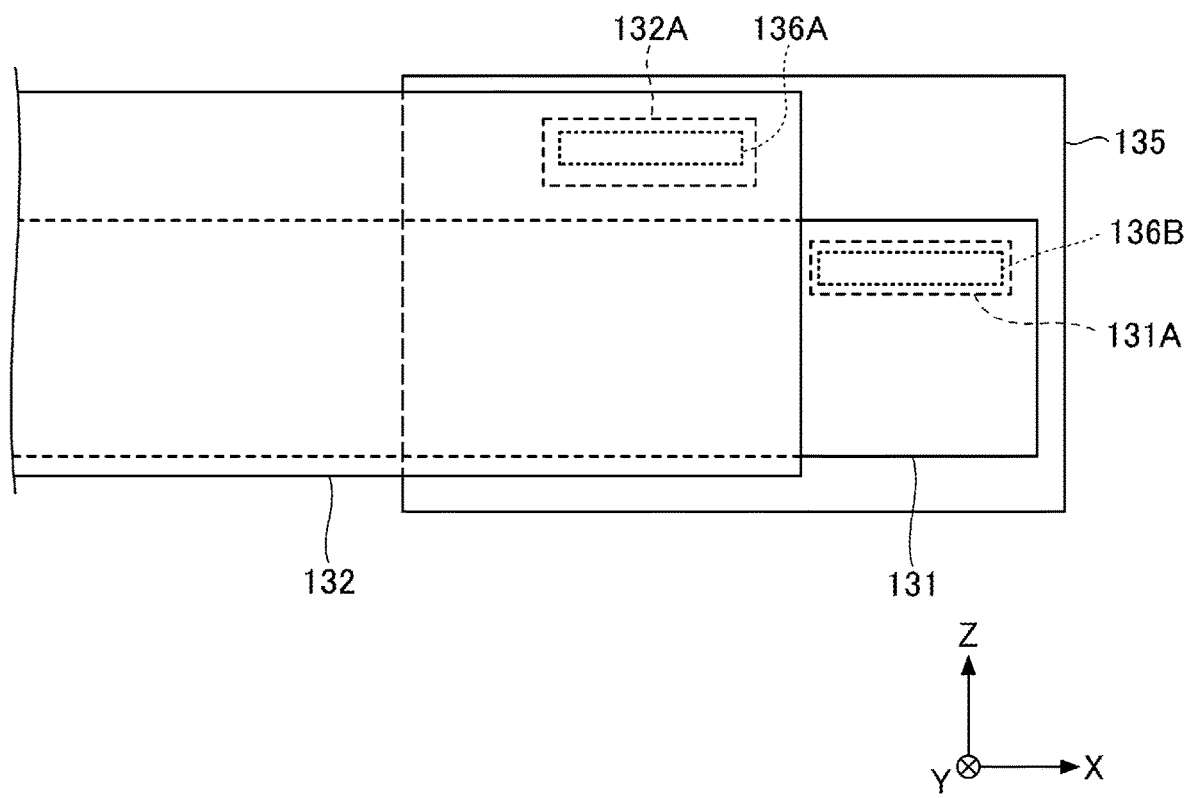

FIG. 14A and FIG. 14B are diagrams illustrating a configuration example of the connection portion of the connection cable 130 in the rotary connector 10 in a fifth modification of the embodiment. FIG. 14A illustrates the main flexible substrates 131 and 132 and the sub-flexible substrate 135 according to the fifth modification in a state where they are not stacked one on another. FIG. 14B illustrates the main flexible substrates 131 and 132 and the sub-flexible substrate 135 according to the fifth modification in a state where they are stacked one on another.

In the fifth modification, as illustrated in FIG. 14A, the second connection terminals 136A and 136B are provided on the first planar portion 135A of the sub-flexible substrate 135 so as to be arranged in the longitudinal direction of the first planar portion 135A (X-axis direction). The second connection terminal 136B is, however, provided such that the connection terminal 136B is offset towards the Z-axis negative side from the second connection terminal 136A.

The upper layer main flexible substrate 132 has a uniform width as a whole. The first connection terminal 132A is provided in proximity to one edge (the edge on the Z-axis positive side) of the end portion of the upper layer main flexible substrate 132.

The lower layer main flexible substrate 131 has a uniform width as a whole. In addition, the width of the lower layer main flexible substrate 131 is narrower than that of the upper layer main flexible substrate 132. The first connection terminal 131A is provided in proximity to one edge (the edge on the Z-axis positive side) of the end portion of the lower layer main flexible substrate 131.

As illustrated in FIG. 14B, in the fifth modification, the width of the lower layer main flexible substrate 131 is narrower than that of the upper layer main flexible substrate 132, so that the second connection terminal 136A can be prevented from being stacked on when the end portion of the main flexible substrate is stacked on the first planar portion 135A.

Therefore, according to the fifth modification, as illustrated in FIG. 14B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the fifth modification, the first connection terminal 132A of the main flexible substrate 132 and the first connection terminal 131A of the main flexible substrate 131 can be simultaneously soldered to the second connection terminals 136A and 136B, respectively.

Sixth Modification

Figure 15A:
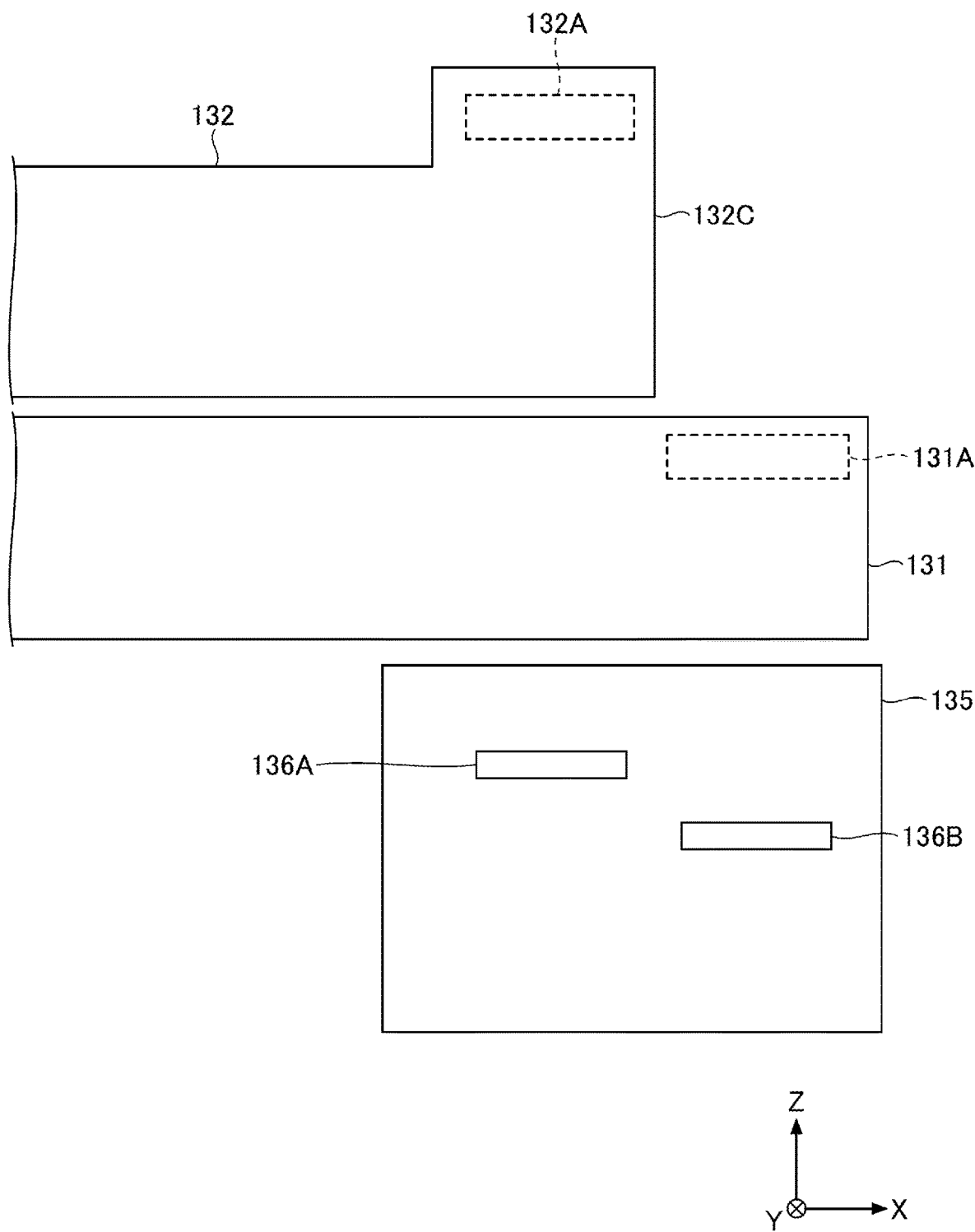

FIG. 15A and FIG. 15B are diagrams illustrating a configuration example of the connection portion of the connection cable 130 in the rotary connector 10 in a sixth modification of the embodiment. FIG. 15A illustrates the main flexible substrates 131 and 132 and the sub-flexible substrate 135 according to the sixth modification in a state where they are not stacked one on another. FIG. 15B illustrates the main flexible substrates 131 and 132 and the sub-flexible substrate 135 according to the sixth modification in a state where they are stacked one on another.

In the sixth modification, as illustrated in FIG. 15A, the second connection terminals 136A and 136B are provided on the first planar portion 135A of the sub-flexible substrate 135 so as to be arranged in the longitudinal direction of the first planar portion 135A (X-axis direction). The second connection terminal 136B is, however, provided such that the connection terminal 136B is offset towards the Z-axis negative side from the second connection terminal 136A.

The lower layer main flexible substrate 131 has a uniform width as a whole. The first connection terminal 131A is provided in proximity to one edge (the edge on the Z-axis positive side) of the end portion of the lower layer main flexible substrate 131.

The upper layer main flexible substrate 132 has substantially the same width as the lower layer main flexible substrate 131. The protruding portion 132C that protrudes outward from one edge (edge on the Z-axis positive side) is provided at the end portion of the upper layer main flexible substrate 132. The protruding portion 132C is provided with the first connection terminal 132A.

As illustrated in FIG. 15B, in the sixth modification, the second connection terminal 136A is provided outside one edge (the edge on the Z-axis positive side) of the lower layer main flexible substrate 131, so that the second connection terminal 136A can be prevented from being stacked on when the end portion of the main flexible substrate is stacked on the first planar portion 135A.

Therefore, according to the sixth modification, as illustrated in FIG. 15B, in a state where the main flexible substrates 131 and 132 and the sub-flexible substrate 135 are stacked one on another, the first connection terminal 132A provided at the end portion of the upper layer main flexible substrate 132 can be soldered to the second connection terminal 136A. Furthermore, according to the sixth modification, the first connection terminal 132A of the main flexible substrate 132 and the first connection terminal 131A of the main flexible substrate 131 can be simultaneously soldered to the second connection terminals 136A and 136B, respectively.

Seventh Modification

Figure 16A:
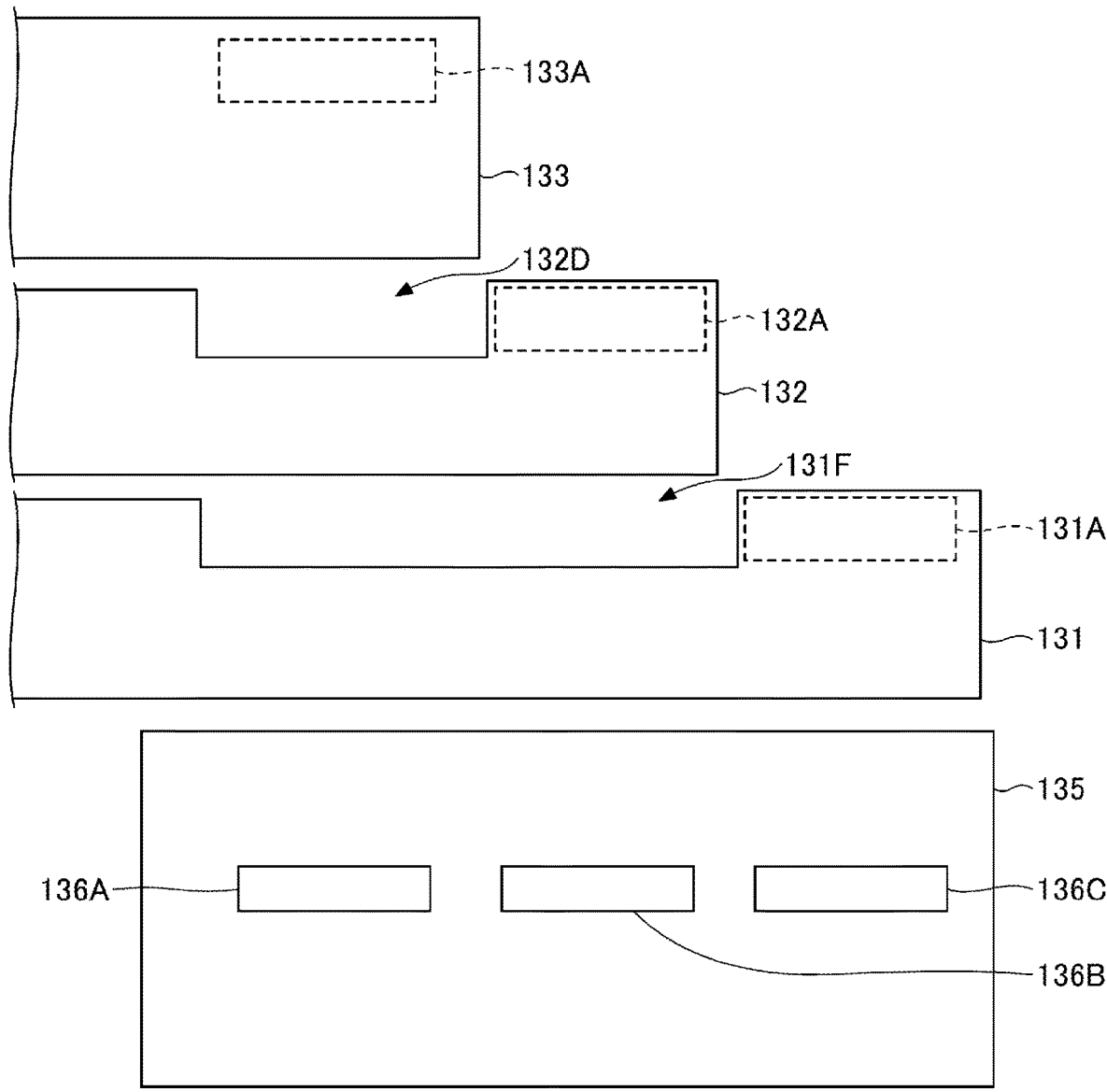
FIGS. 16A and 16B are diagrams illustrating a configuration example of the connecting portion of the connecting cable in the rotary connector in a seventh modification of the embodiment.
Figure 16B:
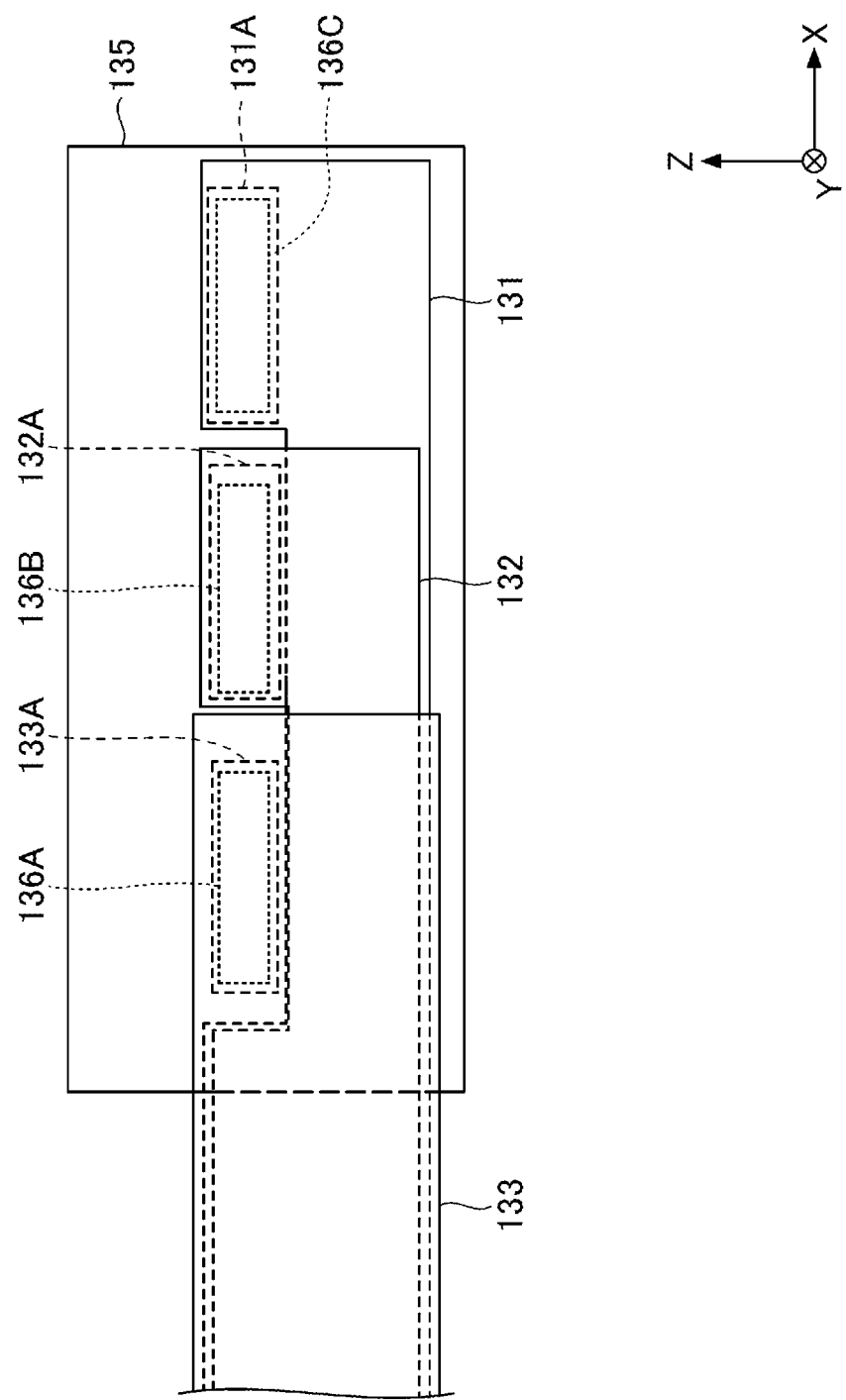

FIG. 16A and FIG. 16B are diagrams illustrating a configuration example of the connection portion of the connection cable 130 in the rotary connector 10 in a seventh modification of the embodiment. FIG. 16A illustrates the main flexible substrates 131 and 132, a main flexible substrate 133, and the sub-flexible substrate 135 according to the seventh modification in a state where they are not stacked one on another. FIG. 16B illustrates the main flexible substrate 131, 132, and 133 and the sub-flexible substrate 135 according to the seventh modification in a state where they are stacked one on another.

In the seventh modification, as illustrated in FIG. 16A, the second connection terminals 136A, 136B, and 136C are provided on the first planar portion 135A of the sub-flexible substrate 135 so as to be arranged in the longitudinal direction of the first planar portion 135A (X-axis direction).

In the seventh modification, the connection cable 130 has a configuration in which end portions of the three main flexible substrates 131, 132, and 133 are stacked one on another. The three main flexible substrates 131, 132, and 133 have substantially the same width.

A first connection terminal 133A is provided in proximity to one edge (the edge on the Z-axis positive side) of the end portion of the upper layer main flexible substrate 133.

The first connection terminal 132A is provided in proximity to one edge (the edge on the Z-axis positive side) of the end portion of the main flexible substrate 132 that is a middle layer.

Furthermore, at the end portion of the middle layer main flexible substrate 132, an avoidance portion 132D having a shape that is cut out inward from one edge (the edge on the Z-axis positive side) is formed at a location overlapping the second connection terminal 136A.

The first connection terminal 131A is provided in proximity to one edge (the edge on the Z-axis positive side) of the end portion of the lower layer main flexible substrate 131.

Furthermore, at the end portion of the lower layer main flexible substrate 131, the avoidance portion 131E having a shape that is cut out inward from one edge (the edge on the Z-axis positive side) is formed at a location overlapping the second connection terminals 136A and 136B.

As illustrated in FIG. 16B, in the seventh modification, the end portion of the lower layer main flexible substrate 131 has the avoidance portion 131E, so that the second connection terminals 136A and 136B can be prevented from being stacked on when the end portion of the main flexible substrate is stacked on the first planar portion 135A. Furthermore, the end portion of the middle layer main flexible substrate 132 has the avoidance portion 132D, so that the second connection terminal 136A can be prevented from being stacked on when the end portion of the main flexible substrate is stacked on the first planar portion 135A.

Therefore, according to the seventh modification, as illustrated in FIG. 16B, in a state where the main flexible substrates 131, 132, and 133 and the sub-flexible substrate 135 are stacked one on another, the first connection terminals 133A provided at the end portion of the upper layer main flexible substrate 133 can be soldered to the second connection terminal 136A, and the first connection terminal 132A provided at the end portion of the middle layer main flexible substrate 132 can be soldered to the second connection terminal 136B. Furthermore, according to the seventh modification, the first connection terminal 133A of the main flexible substrate 133, the first connection terminal 132A of the main flexible substrate 132, and the first connection terminal 131A of the main flexible substrate 131 can be simultaneously soldered to the second connection terminals 136A, 136B, and 136C.

Eighth Modification

Figure 17A:
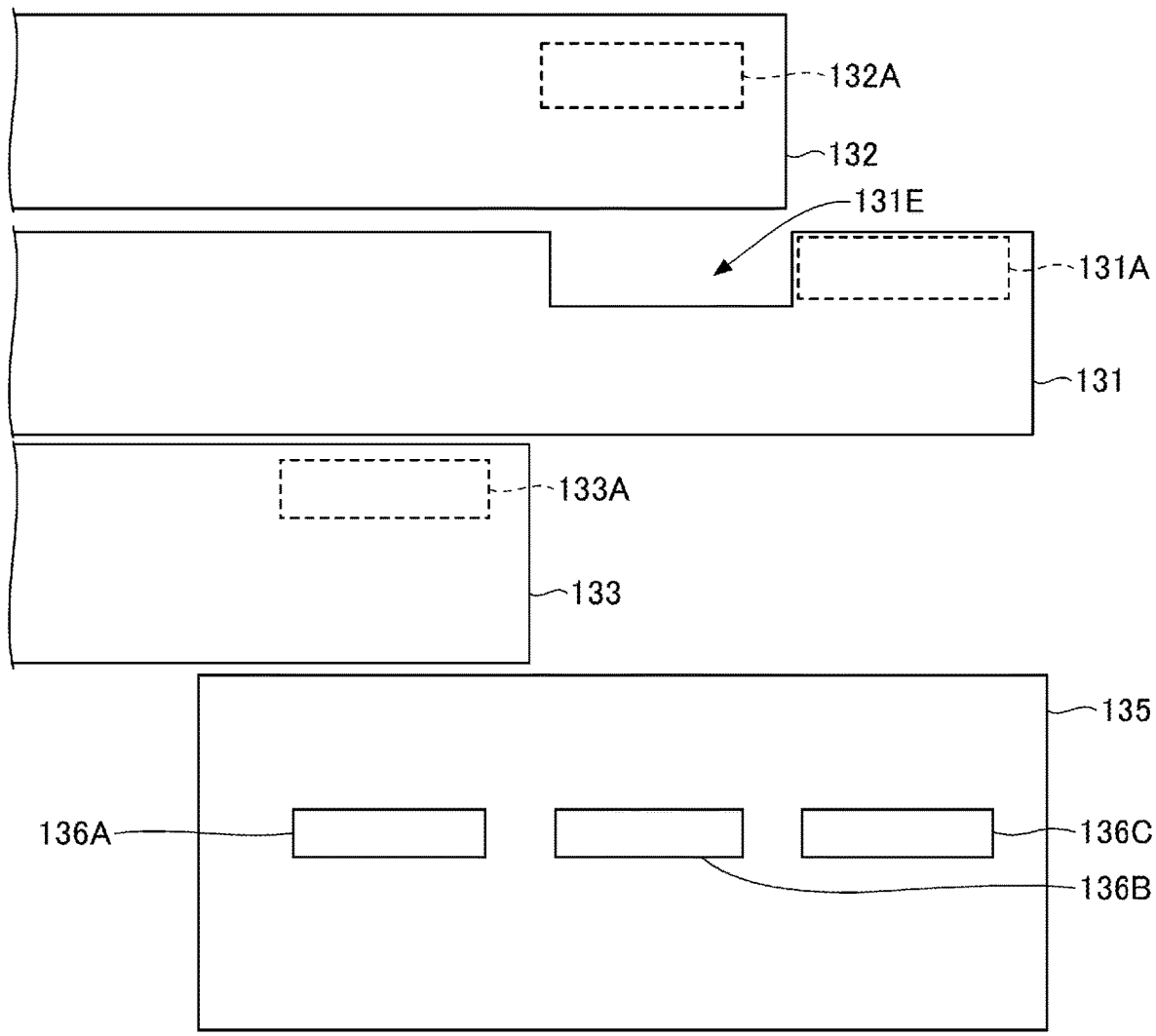
FIGS. 17A to 17C are diagrams illustrating a configuration example of the connecting portion of the connecting cable in the rotary connector in an eighth modification of the embodiment.
Figure 17B:
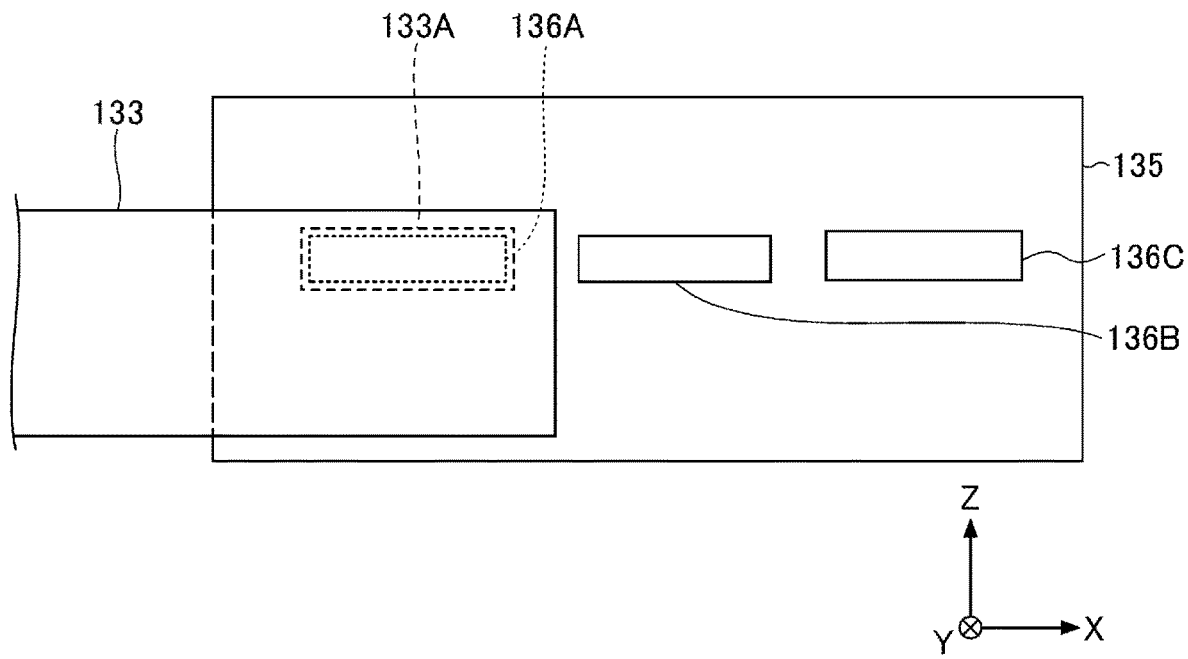
Figure 17C:
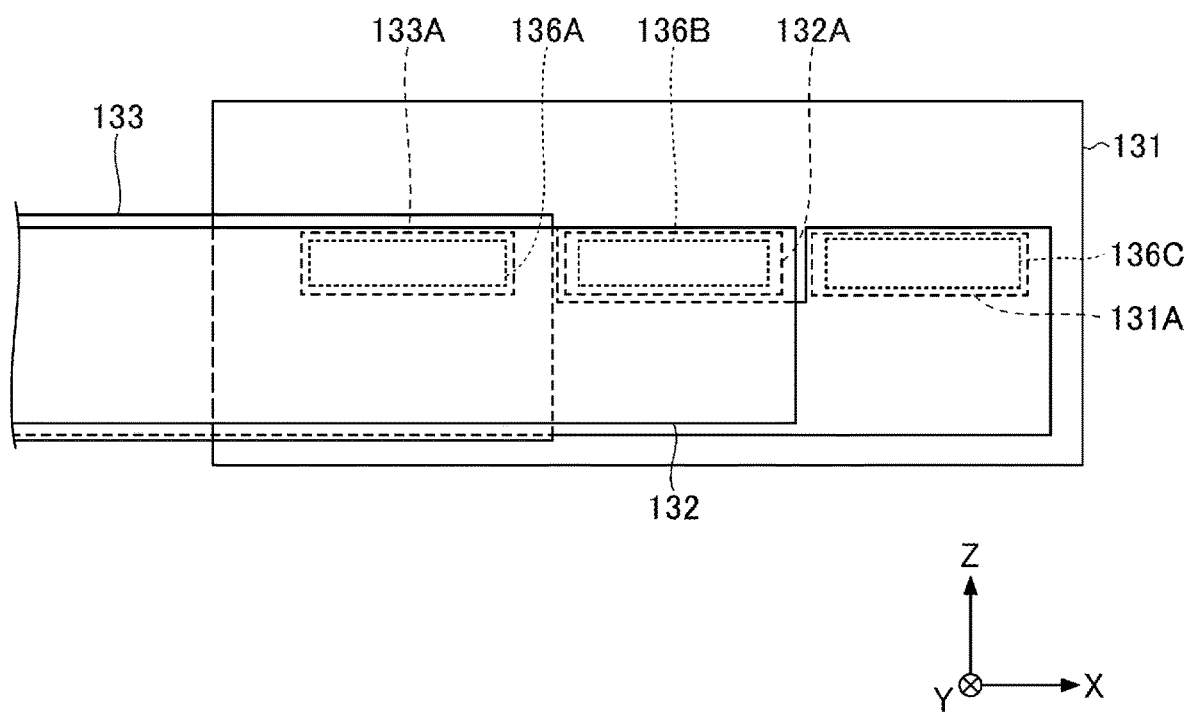

FIG. 17A to FIG. 17C are diagrams illustrating a configuration example of the connection portion of the connection cable 130 in the rotary connector 10 in an eighth modification of the embodiment. FIG. 17A illustrates the main flexible substrate 131, 132, and 133 and the sub-flexible substrate 135 according to the eighth modification in a state where they are not stacked one on another. FIG. 17B illustrates the main flexible substrate 133 and the sub-flexible substrate 135 according to the eighth modification in a state where they are stacked one on another. FIG. 17C illustrates the main flexible substrate 131, 132, and 133 and the sub-flexible substrate 135 according to the eighth modification in a state where they are stacked one on another.

In the eighth modification, as illustrated in FIG. 17A, the second connection terminals 136A, 136B, and 136C are provided on the first planar portion 135A of the sub-flexible substrate 135 so as to be arranged in the longitudinal direction of the first planar portion 135A (X-axis direction).

In the eighth modification, the connection cable 130 has a configuration in which end portions of the three main flexible substrates 131, 132, and 133 are stacked one on another. The three main flexible substrates 131, 132, and 133 have substantially the same width. However, this modification differs from the seventh modification in that the main flexible substrate 133 is the lower layer, the main flexible substrate 131 is the middle layer, and the main flexible substrate 132 is the upper layer.

The first connection terminal 133A is provided in proximity to one edge (the edge on the Z-axis positive side) of the end portion of the lower layer main flexible substrate 133.

The first connection terminal 132A is provided in proximity to one edge (the edge on the Z-axis positive side) of the end portion of the upper layer main flexible substrate 132.

It is, however, different from the seventh modification in that the end portion of the upper layer main flexible substrate 132 does not include the avoidance portion 132D.

The first connection terminal 131A is provided in proximity to one edge (the edge on the Z-axis positive side) of the end portion of the middle layer main flexible substrate 131.

Furthermore, at the end portion of the middle layer main flexible substrate 131, the avoidance portion 131E having a shape that is cut out inward from one edge (the edge on the Z-axis positive side) is formed at a location overlapping the second connection terminal 136B.

In the eighth modification, as illustrated in FIG. 17B, first, the end portion of the lower layer main flexible substrate 133 is disposed so as to overlap the first planar portion 135A, and the first connection terminal 133A provided at the end portion of the lower layer main flexible substrate 133 is soldered to the second connection terminal 136A.

Thereafter, as illustrated in FIG. 17C, the end portions of the middle layer main flexible substrate 131 and the upper layer main flexible substrate 132 are disposed so as to overlap the first planar portion 135A. Since, as illustrated in FIG. 17C, in the eighth modification, the end portion of the middle layer main flexible substrate 131 has the avoidance portion 131E, the second connection terminal 136B can be prevented from being stacked on when the end portion of the main flexible substrate 131 is stacked on the first planar portion 135A.

Therefore, according to the eighth modification, as illustrated in FIG. 17C, in a state where the main flexible substrate 131, 132, and 133 and the sub-flexible substrate 135 are stacked one on another, the first connection terminals 132A provided at the end portion of the upper layer main flexible substrate 132 can be soldered to the second connection terminals 136B. Furthermore, according to the eighth modification, the first connection terminal 132A of the main flexible substrate 132 and the first connection terminal 131A of the main flexible substrate 131 can be simultaneously soldered to the second connection terminals 136B and 136C.

Although one or more embodiments of the present disclosure has been described in detail above, the present disclosure is not limited to the embodiment, and various modifications or changes can be made within the scope of the gist of the present disclosure described in the claims.

For example, the "avoidance portion" is not limited to a shape cut out inward from the edge of the main flexible substrate, and may have an opening shape formed on the inner side from the edge of the main flexible substrate.

Furthermore, in all the examples described above, the main flexible substrate on a side near the wiring member has a shape that does not overlap one or more of the second connection terminals corresponding to the first connection terminals of the main flexible substrate on a side distant from the wiring member. However, by switching the top and the bottom of the laminated structure of the main flexible substrates, the main flexible substrate on the side distant from the wiring member may have a shape that does not overlap one or more of the second connection terminals corresponding to the first connection terminals of the main flexible substrate on the side near the wiring member. In this case, it is possible to prevent heating and pressurization of the bonding portion by the jig at the time of solder connection that are caused due to the main flexible substrate on the side distant from the wiring member overlaps one or more of the second connection terminals corresponding to the first connection terminals of the main flexible substrate on the side near the wiring member. Therefore, as the examples described above, it is possible to simultaneously solder flexible substrates in a mutually stacking state.

Furthermore, the configuration of the present disclosure may be applied to the configuration of some of the main flexible substrates in a case where the connection terminals at the end portions of the main flexible substrates are connected to the respective connection terminals of the wiring member in a state where the plurality of main flexible substrates are stacked one on another. Even in this case, since some of the plurality of main flexible substrates can be simultaneously bonded to the connection terminals of the wiring member, an effect of suppressing an increase in the number of work processes and work process complication can be achieved.

According to one embodiment, in the rotary connector, when a plurality of main flexible substrates are bonded to a sub-flexible substrate in a state where the main flexible substrates are stacked one on another, an increased number of work processes and work process complication can be suppressed.

What is claimed is:

1. A rotary connector comprising:
a stator;
a rotor provided to be rotatable relative to the stator;
a plurality of main flexible substrates accommodated in an annular space between the stator and the rotor, each main flexible substrate of the plurality of main flexible substrates including a first connection terminal provided at an end portion of the main flexible substrate; and
a wiring member including a plurality of second connection terminals to each of which the first connection terminal of a respective one of the plurality of main flexible substrates is connected,
wherein the plurality of main flexible substrates are disposed on the wiring member in a state where the plurality of main flexible substrates are stacked one on another at the end portion of each main flexible substrate,
wherein the plurality of main flexible substrates include
a first main flexible substrate on a side near the wiring member, and
a second main flexible substrate on a side distant from the wiring member, and
wherein the end portion of the first main flexible substrate has a shape that does not overlap, in a plan view, one or more of the second connection terminals to each of which the first connection terminal of the second main flexible substrate is connected.

2. The rotary connector according to claim 1, wherein the plurality of main flexible substrates are drawn out from the wiring member in mutually a same direction.

3. The rotary connector according to claim 1, wherein the end portion of the first main flexible substrate includes an avoidance portion in which a part of a belt shape of a constant width is cut out,
wherein the avoidance portion does not overlap, in a plan view, one or more of the second connection terminals to each of which the first connection terminal of the second main flexible substrate is connected.

4. The rotary connector according to claim 3, wherein the avoidance portion has a cutout disposed inwardly from an edge of the first main flexible substrate in a widthwise direction.

5. The rotary connector according to claim 3, wherein the avoidance portion has an opening disposed inwardly from an edge of the first main flexible substrate in a widthwise direction.

6. The rotary connector according to claim 1, wherein the wiring member includes a sub-flexible substrate.

7. The rotary connector according to claim 6, further comprising:
a holding member having a holding surface that holds the sub-flexible substrate from a back surface side of the sub-flexible substrate,
wherein the holding surface includes a base portion partially protruding from the holding surface, the base portion being situated at a location corresponding to each of the second connection terminals to which the first connection terminal of the second main flexible substrate is connected.

8. The rotary connector according to claim 7, wherein the base portion allows a height of the second connection terminals to each of which the first connection terminal of the second main flexible substrate is connected from the holding surface, to be substantially equal to a height of a surface of the first main flexible substrate from the holding surface.

9. The rotary connector according to claim 7, wherein the sub-flexible substrate includes a tongue portion that is partially bendable, and
wherein each of the second connection terminals disposed at a location overlapping the base portion in a plan view is provided in the tongue portion.

10. The rotary connector according to claim 9, wherein the sub-flexible substrate includes a substantially rectangular planar portion on which the plurality of second connection terminals are disposed, the planar portion having a slit, and
wherein the tongue portion is provided in the planar portion, by the slit of the planar portion.

* * * * *